United States Patent
Terry et al.

(10) Patent No.: US 7,572,740 B2
(45) Date of Patent: Aug. 11, 2009

(54) METHODS FOR OPTIMIZING THIN FILM FORMATION WITH REACTIVE GASES

(75) Inventors: Mason Terry, Redwood City, CA (US);
Malcolm Abbott, Sunnyvale, CA (US);
Maxim Kelman, Mountain View, CA (US); Andreas Meisel, Redwood City, CA (US); Dmitry Poplavskyy, San Jose, CA (US); Eric Schiff, DeWitt, NY (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 12/060,528

(22) Filed: Apr. 1, 2008

(65) Prior Publication Data
US 2008/0254601 A1    Oct. 16, 2008

Related U.S. Application Data

(60) Provisional application No. 60/921,710, filed on Apr. 4, 2007.

(51) Int. Cl.
*H01L 21/302* (2006.01)
*H01L 21/461* (2006.01)

(52) U.S. Cl. .................. 438/752; 438/753; 438/474; 438/475; 257/E21.17; 257/E21.102; 257/E21.115; 257/E21.319; 257/E21.347

(58) Field of Classification Search ............ 438/474, 438/475, 513, 602, 603, 604, 621, 680, 752, 438/753, 779, 780, 788
See application file for complete search history.

(56) References Cited

U.S. PATENT DOCUMENTS

| | | | |
|---|---|---|---|
| 4,040,849 | A | 8/1977 | Greskovich et al. |
| 4,262,631 | A | 4/1981 | Kubacki |
| 4,330,358 | A | 5/1982 | Grabmaier et al. |
| 4,407,858 | A | 10/1983 | Hanke et al. |
| 4,876,218 | A | 10/1989 | Pessa et al. |

(Continued)

FOREIGN PATENT DOCUMENTS

DE      19904082      8/2000

(Continued)

OTHER PUBLICATIONS

International Search Report for PCT/US2008/059038 dated Jul. 18, 2008.

(Continued)

*Primary Examiner*—David Nhu
(74) *Attorney, Agent, or Firm*—Foley & Lardner LLP

(57) ABSTRACT

A method for producing a Group IV semiconductor thin film in a chamber is disclosed. The method includes positioning a substrate in the chamber, wherein the chamber further has a chamber pressure. The method further includes depositing a nanoparticle ink on the substrate, the nanoparticle ink including set of Group IV semiconductor nanoparticles and a solvent, wherein each nanoparticle of the set of Group IV semiconductor nanoparticles includes a nanoparticle surface, wherein a layer of Group IV semiconductor nanoparticles is formed. The method also includes striking a hydrogen plasma; and heating the layer of Group IV semiconductor nanoparticles to a fabrication temperature of between about 300° C. and about 1350° C., and between about 1 nanosecond and about 10 minutes; wherein the Group IV semiconductor thin film is formed.

23 Claims, 8 Drawing Sheets

U.S. PATENT DOCUMENTS

| | | | |
|---|---|---|---|
| 4,910,167 | A | 3/1990 | Lee et al. |
| 5,057,163 | A | 10/1991 | Barnett et al. |
| 5,141,893 | A | 8/1992 | Ito et al. |
| 5,262,357 | A | 11/1993 | Alivisatos et al. |
| 5,336,335 | A | 8/1994 | Hall et al. |
| 5,556,791 | A | 9/1996 | Stevens et al. |
| 5,576,248 | A | 11/1996 | Goldstein |
| RE36,156 | E | 3/1999 | Hall et al. |
| 5,958,329 | A * | 9/1999 | Brown ........................ 266/176 |
| 6,080,606 | A | 6/2000 | Gleskova et al. |
| 6,111,191 | A | 8/2000 | Hall et al. |
| 6,559,479 | B1 | 5/2003 | Lüdemann |
| 6,623,559 | B2 * | 9/2003 | Huang ........................ 117/87 |
| 6,688,494 | B2 * | 2/2004 | Pozarnsky et al. ............. 222/4 |
| 6,878,871 | B2 | 4/2005 | Scher et al. |
| 6,984,265 | B1 | 1/2006 | Raguse et al. |
| 7,446,335 | B2 * | 11/2008 | Kortshagen et al. ............ 257/51 |
| 2002/0192956 | A1 | 12/2002 | Kizilyalli Isik et al. |
| 2003/0003300 | A1 | 1/2003 | Korgel et al. |
| 2003/0226498 | A1 | 12/2003 | Alivisatos et al. |
| 2005/0005851 | A1 * | 1/2005 | Keshner et al. .......... 118/723 E |
| 2005/0008880 | A1 | 1/2005 | Kunze et al. |
| 2005/0104125 | A1 | 5/2005 | Sato et al. |
| 2005/0126628 | A1 | 6/2005 | Scher et al. |
| 2006/0051505 | A1 | 3/2006 | Kortshagen et al. |
| 2006/0154036 | A1 | 7/2006 | Kunze et al. |
| 2006/0237719 | A1 | 10/2006 | Colfer et al. |
| 2008/0160265 | A1 | 7/2008 | Hieslmair et al. |
| 2008/0160733 | A1 | 7/2008 | Hieslmair et al. |

FOREIGN PATENT DOCUMENTS

| | | |
|---|---|---|
| GB | 1048564 A | 11/1966 |
| GB | 1077224 A | 7/1967 |
| WO | WO 2004/023527 | 3/2004 |
| WO | WO 2006/096201 | 9/2006 |
| WO | WO 2008/039757 | 4/2008 |
| WO | WO 2008/073763 | 6/2008 |
| WO | WO 2008/076744 | 6/2008 |

OTHER PUBLICATIONS

Christiansen, T. et al., "Standard Operating Procedure: Spin-on-Glass Surface Level Characterization," Jun. 8, 2000.

Jang, W. I. et al., "Fabrication of MEMS Devices by Using Anhydrous HF Gas-phase Etching with Alcoholic Vapor" *J. Micromech. Microeng.*, vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies" *IEEE Transactions on Components, Packaging, and Manufacturing Technology—Part A*, vol. 18, No. 3, Sep. 1995 pp. 471-477.

Lee, J. H. et al, "Gas-Phase Etching of Sacrificial Oxides Using Annhydrous HF and $CH_3OH$," $10^{th}$ Annual International Workshop on MEMS, *IEEE*, Jan. 26-30, 1997, pp. 448-453.

Orfert, M. et al., "Plasma Enhanced Chemical Vapor Deposition of SiN-films For Passivation of Three-Dimensional Substrates," *Surface and Coatings Technology* 116-119, 1999, pp. 622-628; published by Elsevier Science S.A.

Schmid, P. et al, "Plasma Deposition of Si-N and Si-O Passivation Layers on Three-Dimensional Sensor Devices," *Surface and Coating Technology* 98, 1998, pp. 1510-1517; published by Elsevier Science S.A.

D. V. Melnikov et al., "Quantum Confinement in Phosphorous-Doped Silicon Nanocrystals," *Physical Review Letters*, vol. 92 (2004), pp. 046802-1-046802-4.

Y. H. Tang et al., "Microstructure and Filed-Emission Characteristics of Boron-Doped SI Nanoparticle Chains," *Applied Physics Letters*, vol. 79 (2001), pp. 1673-1675.

T. Ifuku et al., "Fabrication of Nanocrystalline Silicon with Small Spread of Particle Size by Pulsed Gas Plasma," *Japanese Journal of Applied Physics*, vol. 36 (1997), pp. 4031-4034.

A. N. Goldstein, "The Melting of Silicon Nanocrystals: Submicron Thin-film Structures Derived from Nanocrystal Precursors," *Applied Physics A*, V. 62 (1996) pp. 33-37.

Ai et al., "Preparaation and characterization of Si sheets by renewed SSP technique," *Journal of Crystal Growth*, vol. 270 (2004), pp. 446-454.

Q. Ban, et al., "Substrate Materials for Poly-CSiTF Solar Cells: Optimization of Silicon Sheet from Powder," *Acta Metallurgica Sinica*, vol. 18, No. 3 (Jun. 2005), pp. 184-188.

Q Ban et al., "Study on Preparation Technology of Polycrystalline Silicon Thin Film Solar Cells Based on SSP Substrate," *Acta Energiae Solaris Sinica*, vol. 25, No. 1 (Feb. 2004), pp. 95-98.

Bet et al., "Laser Forming of Silicon Films Using Nanoparticle Precursor," *Journal of Electronic Materials*, vol. 35, No. 5 (2006), pp. 993-1004.

Britton, D.T. and M. Härting, "Printed Nanoparticulate Composites for Silicon Thick Film Electronics," *Pure and Applied Chemistry*, vol. 78, No. 9 (2006), 1723-1739.

Ghosh et al., "Theory of the electrical and photovoltaic properties of polycrystalline silicon," *Journal of Applied Physics*, vol. 51, No. 1 (1980) pp. 446-454.

Grovenor, C R M, "Grain boundaries in semiconductors," *J. Phys. C: Solid State Phys.*, vol. 18 (1985), pp. 4079-4119.

Liang et al, "Characterisation of direct epitaxial silicon thin film solar cells on a low-cost substrate," *Solar Energy Materials & Solar Cells*, vol. 80 (2003), pp. 181-193.

Mataré, H.F., "Carrier transport at grain boundaries in semiconductors," *Journal of Applied Physics*, vol. 56, No. 10 (1984), pp. 2605-2631.

McCann et al, "A Review of Thin Film Crystalline Silicon for Solar Cell Applications. Part 1: Native Substrates," *Solar Energy Materials and Solar Cells*, vol. 68, No. 2 (May 2001), pp. 135-171.

Möller et al., "Sintering of Ultrafine Silicon Powder," *Journal of the American Ceramic Society*, vol. 68, No. 6 (1985), pp. 320-325.

Yang et al., "Effect of pressure on melting temperature of silicon," *Journal of Physics: Condensed Matter*, vol. 15 (2003), pp. 4961-4965.

"Crystalline Silicon Thin-Film Solar Cells," a Product Information Sheet published by Fraunhofer Institut Solare Energie Systeme, Oct. 2001, pp. 1-6.

T. Shiga et al., "Photovoltaic performance and stability of CdTe/polymeric hybrid solar cells using a C60 buffer layer," *Solar Energy Materials and Solar Cells*, vol. 90, No. 12, (Jan. 2006), pp. 1849-1858; published by Elsevier Science Publishers, Amsterdam, NL.

J. R. Heath et al., "Nanocrystals Seeding: A Low Temperature Route to Polycrystaline Si Films," *Applied Phys. Lett.*, vol. 64, No. 26 (Jun. 27, 1994), pp. 3569-3571.

G. Samdani et al., "Tiny Particles Aim for Big Markets," *Chemical Eng.*, Aug. 1994, pp. 35-39.

Goldstein et al., "Melting in Semiconductor Nanocrystals," vol. 256, Jun. 1992, pp. 1425-1427.

Buffat et al., "Size Effect on the Melting Temperature of Gold Particles," *Physical Review A*, Jun. 1976.

Ercolessi et al., "Melting of Small Gold Particles: Mechanism and Size Effects," *Physical Review Letters*, vol. 66, No. 7 (Feb. 1991).

M. Wautelet, "Estimation of the Variation of the Melting Temperature with the Size of Small Particles . . . ," *J. Phys. D: Appl Phys*, vol. 24 (1991), pp. 343-346.

Berry et al., "Melting of clusters and melting," *Physical Review A*, vol. 30, No. 2.

The International Search Report for PCT/US2007/087205, mailed May 28, 2008.

The International Search Report for PCT/IB2004/000221 (WO 2004/068536 A2), mailed Aug. 30, 2004.

The International Search Report for PCT/US2007/077765, mailed Feb. 1, 2008.

The International Search Report for PCT/US2007/086376, mailed May 28, 2008.

The International Search Report for PCT/US2007/086432, mailed May 28, 2008.

The International Search Report for PCT/US2007/076549, mailed Jul. 25, 2008.

The International Search Report for PCT/US2007/070134, mailed Aug. 11, 2008.

Written Opinion for PCT/US2008/059038, mailed Jul. 18, 2008.

* cited by examiner

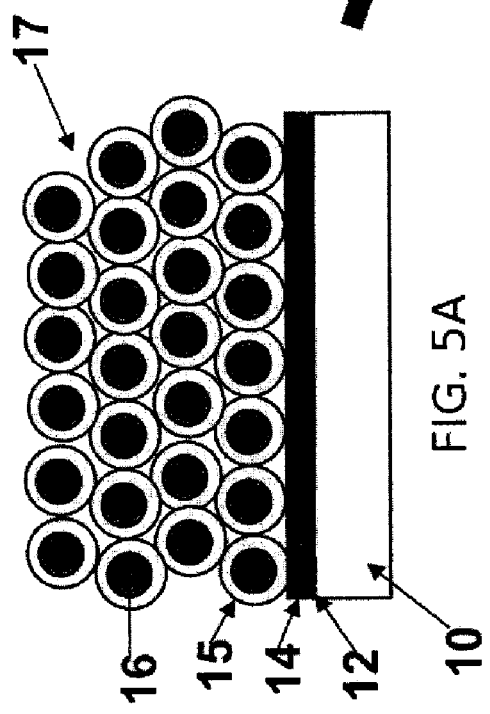
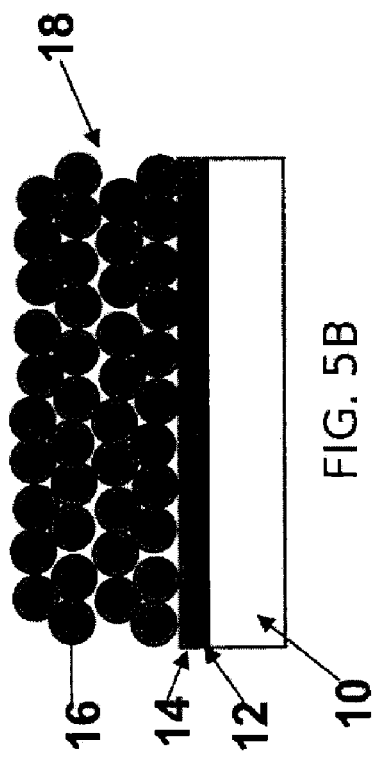
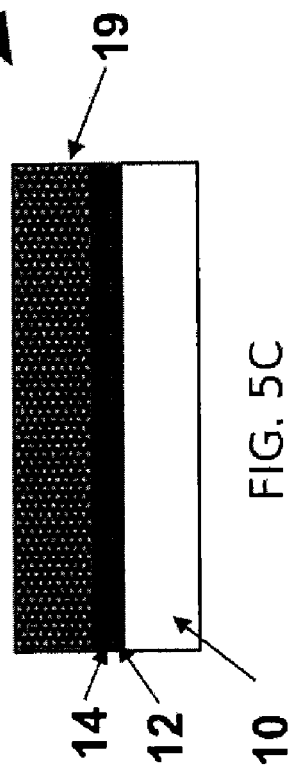
FIG. 5A
FIG. 5B
FIG. 5C

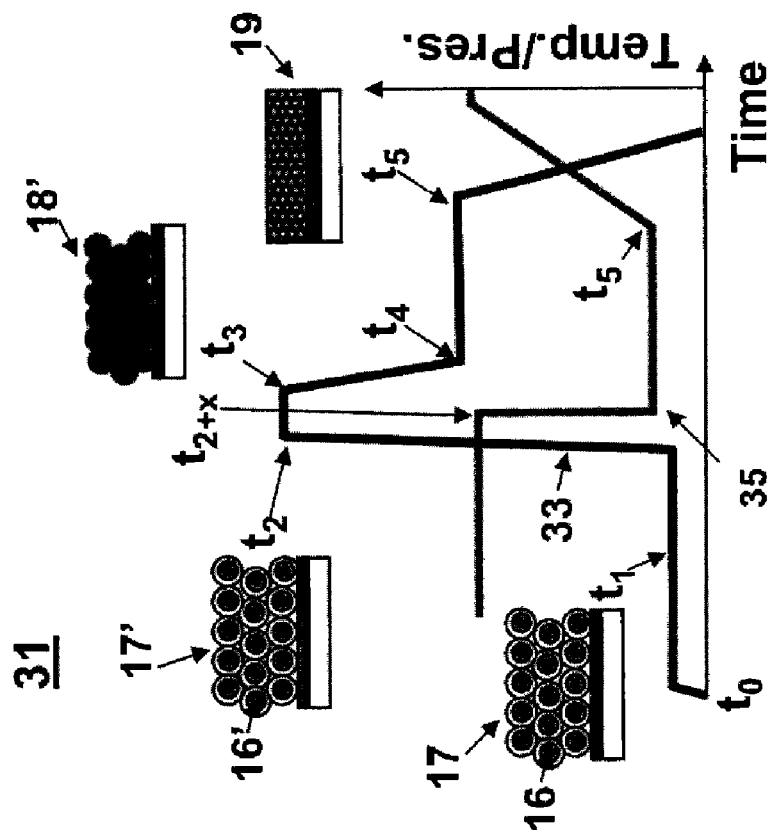
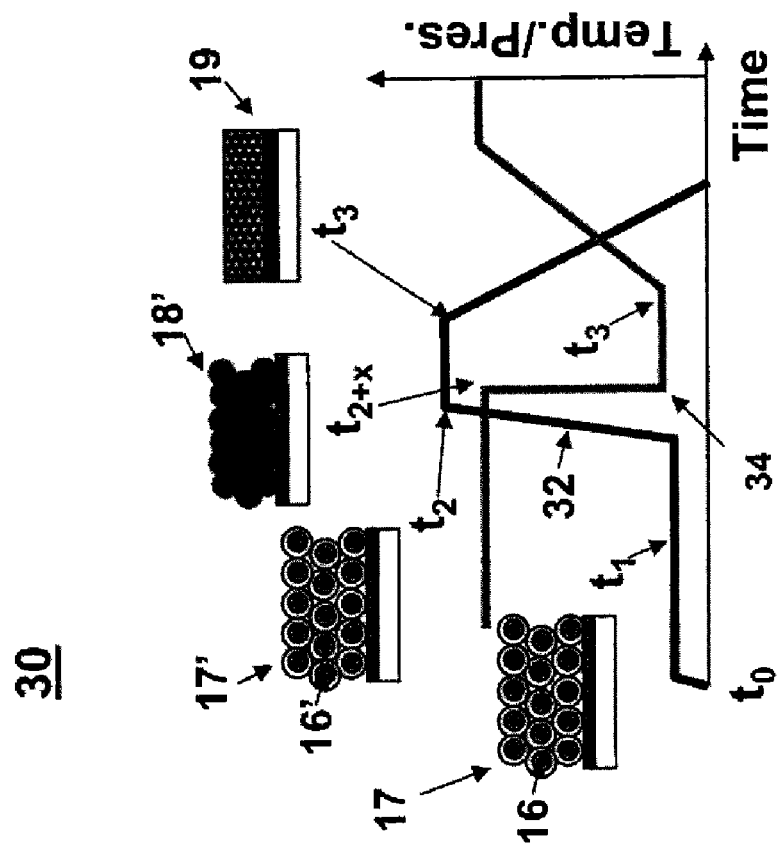
FIG. 7B
FIG. 7A

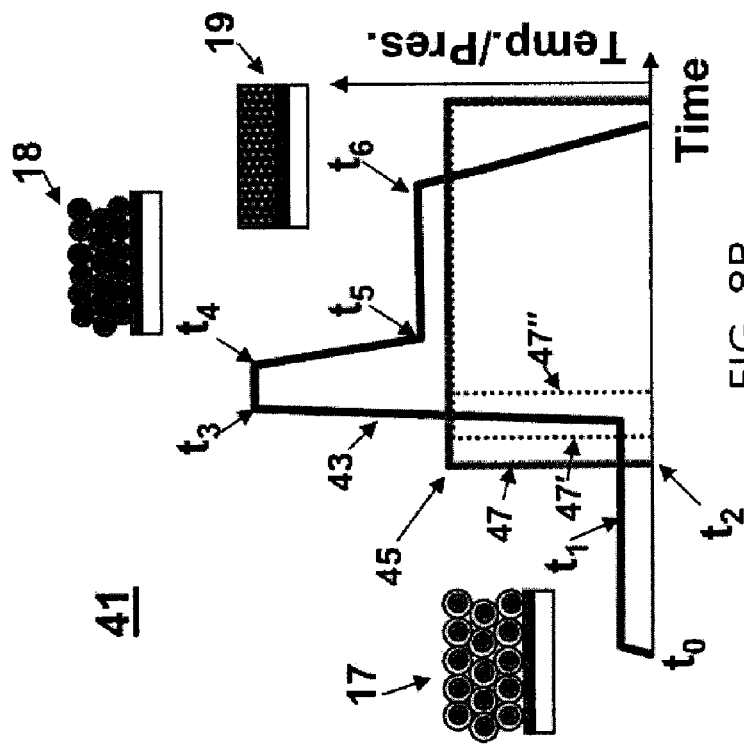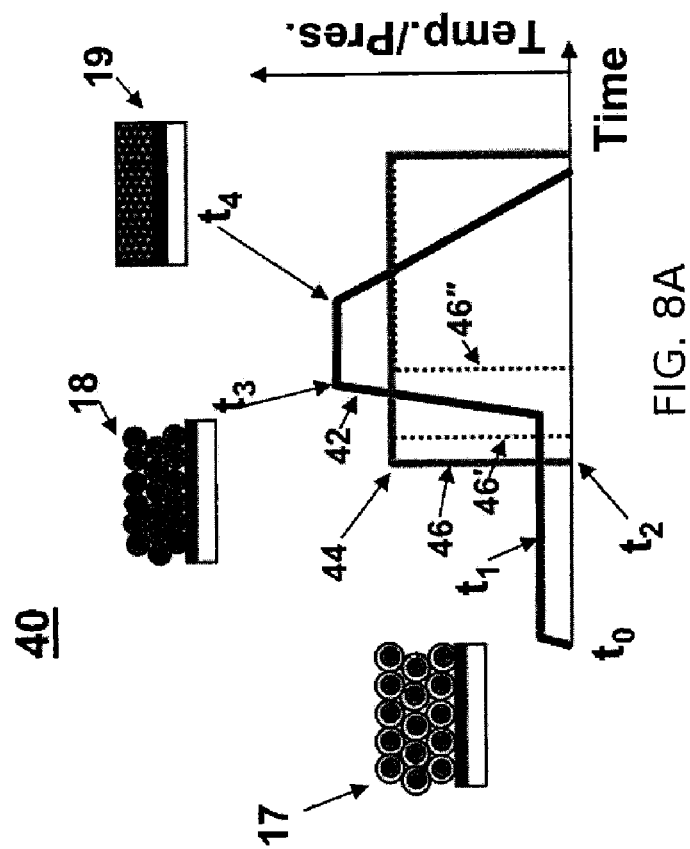

METHODS FOR OPTIMIZING THIN FILM FORMATION WITH REACTIVE GASES

CROSS-REFERENCE TO RELATED APPLICATIONS

This application claims the benefit of U.S. Pat. App. No. 60/921,710, entitled "In Situ Processing Of Thin Films Fabricated From Group IV Semiconductor Nanoparticles," filed Apr. 4, 2007, which is incorporated by reference.

FIELD OF THE INVENTION

The present invention relates in general to Group IV semiconductor thin films, and in particular to the fabrication of semiconductor thin films from Group IV semiconductor nanoparticles.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those elements in the fourth column of the periodic table (e.g., carbon, silicon, germanium, etc.).

Chemical vapor deposition (CVD) is often used in the processing of semiconductors. In a typical CVD process, the wafer (substrate) may be exposed to one or more volatile precursors, which react and/or decompose on the substrate surface to produce the desired deposit. However, commonly used CVD processes may be problematic. For example, CVD processed tend to have slow deposition rates, which limit the cost-effective fabrication of a range of film thicknesses. In addition, large components are often difficult to position in CVD chambers, high processing temperatures must generally be used, and substantial chemical wastes are often produced.

An alternate manufacturing technique involves the deposition and densification on a wafer of nanocrystalline silicon particles formulated in a solvent-binder carrier. For example, nanoparticles may be mixed with organic binders (e.g., polystyrene) in solvents (e.g., chloroform) to produce semiconductor inks that were printed on bond paper. See WO Patent Application No. 2004IB00221.

Alternatively, composite thin films of both unhydrogenated passivated Group IV semiconductor nanoparticles (having diameters below 10 nm) and hydrogenated amorphous Group IV materials may be first deposited and then sintered on a wafer. Consequently, the combination of smaller nanoparticles with larger Group IV materials allows the processing temperature to be decreased to about 400° C. See U.S. Patent Application No. 20060154036.

However, in both of these examples, significant amounts of organic materials are used in the Group IV semiconductor thin film layers, leading to high processing costs, and the composites formed are substantially different than the well-accepted native Group IV semiconductor thin films.

Therefore, there is a need for native Group IV semiconductor thin films fabricated with relatively high volume processing methods.

SUMMARY

The invention relates, in one embodiment, to a method for producing a Group IV semiconductor thin film in a chamber. The method includes positioning a substrate in the chamber, wherein the chamber further has a chamber pressure. The method further includes depositing a nanoparticle ink on the substrate, the nanoparticle ink including set of Group IV semiconductor nanoparticles and a solvent, wherein each nanoparticle of the set of Group IV semiconductor nanoparticles includes a nanoparticle surface, wherein a layer of Group IV semiconductor nanoparticles is formed. The method also includes striking a hydrogen plasma; and heating the layer of Group IV semiconductor nanoparticles to a fabrication temperature of between about 300° C. and about 1350° C., and between about 1 nanosecond and about 10 minutes; wherein the Group IV semiconductor thin film is formed.

BRIEF DESCRIPTION OF THE DRAWINGS

FIGS. 5A-5C show a simplified diagram of the formation of a Group IV semiconductor thin film from oxygen-covered Group IV semiconductor nanoparticles, in accordance with the invention;

FIGS. 7A-7B show simplified temperature and pressure profiles as a function of time for the in situ fabrication of Group IV semiconductor thin films using a vacuum for at least a portion of the fabrication process, in accordance with the invention; and FIGS. 8A-8B show simplified temperature and pressure profiles as a function of time for the in situ fabrication of Group IV semiconductor thin films using a hydrogen plasma, in accordance with the invention.

DETAILED DESCRIPTION

Figure 1:
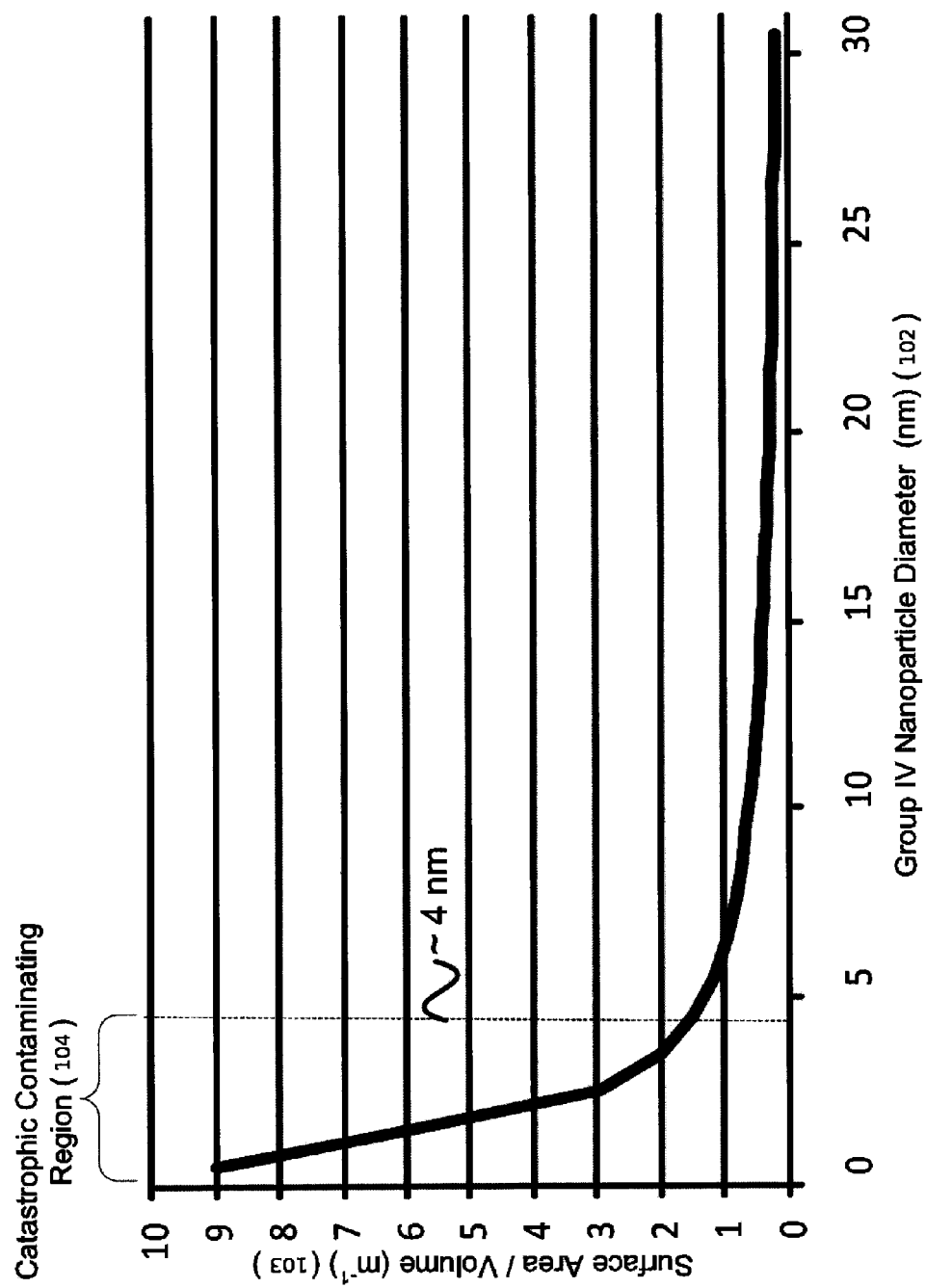
FIG. 1 shows a simplified diagram comparing surface area/volume to diameter for a set of silicon nanoparticles, in accordance with the invention.

The present invention will now be described in detail with reference to a few configurations thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventors that thin films formed from native Group IV semiconductor nanoparticles may be produced using high volume processing methods.

Characteristics of Group IV Nanoparticles

In general, Group IV semiconductor nanoparticles have an average diameter between about 1.0 nm to 100.0 nm, and are composed of silicon, germanium, carbon, and alpha-tin, or combinations thereof. In addition, Group IV semiconductor nanoparticles may be doped and may further be terminated by one or more atoms selected from the group consisting of hydrogen, oxygen, sulfur, carbon and nitrogen.

Furthermore, Group IV semiconductor nanoparticles may be single-crystalline, polycrystalline, or amorphous in nature, and may further include elongated particle shapes, such as nanowires, or irregular shapes, in addition to more regular shapes, such as spherical, hexagonal, and cubic nanoparticles, and mixtures thereof.

In comparison to a bulk material, which typically has a thickness greater than about 100 nm and tends to have constant physical properties regardless of its size (e.g., melting temperature, boiling temperature, density, conductivity, etc.), nanoparticles may have physical properties that are size dependent, and hence useful for various applications. For example, semiconductor nanoparticles may be more easily and economically patterned into forming p-n junctions when compared to alternate methods, such as silk-screening, diffusion from a solid source, or deposition.

However, because they have substantially larger surface areas in comparison to bulk solids, Group IV nanoparticles also tend to be very susceptible to contamination. In general, since it is extremely difficult to completely prevent ambient oxygen or water molecules from coming into contact with the Group IV nanoparticles, contamination often occurs from such chemical reactions such as oxidation and/or hydrolysis. Consequently, even small amounts of contamination may inhibit sintering (i.e., interfering with the physical connection of the Group IV nanoparticles), delay dense layer formation (i.e., increasing material porosity and thus decreasing conductivity), and provide electron-hole recombination sites (i.e., attenuating current generation in the assembled junction).

In an advantageous manner, the Group IV nanoparticles may be formed into a substantially spherical shape in order to minimize contamination. In general, of all the solids having a given volume, a sphere is the one with the smallest surface area. Likewise, of all solids having a given surface area, the sphere is the one having the greatest volume. Consequently, a spherical nanoparticle will tend to shield the greatest number of Group IV atoms from contamination, and hence is beneficial to junction creation.

In general, semiconductor nanoparticles typically must be formed into both dense and low porosity connected regions. One such method is sintering. Sintering is generally a method for making particles adhere to each other, and interacting nanocrystals sinter before size-dependent melting occurs. See A. N. Goldstein, The melting of silicon nanocrystals: Submicron thin-film structures derived from nanocrystal precursors, APPLIED PHYSICS A., 1996.

During sintering, the density of grains may increase as material flows into voids, causing a decrease in the overall volume of thin films. Movement of atoms that occurs during sintering effects the reduction of total porosity by repacking, followed by material transport from the bulk to the surface of the thin film, or from the surface of the thin film into the gas phase.

Consequently, Group IV semiconductor nanoparticles that are substantially spherical and preferably between about 4 nm and about 100 nm in diameter tend to sinter at lower temperatures, and hence are beneficial to create junctions. In yet another configuration, the Group IV semiconductor nanoparticles are substantially spherical and more preferably between about 4.0 nm and about 20.0 nm in diameter. In yet another configuration, the Group IV semiconductor nanoparticles are substantially spherical and most preferably 7.0 nm.

Temperatures are preferably selected so as to enable sufficient sintering of the layer of Group IV semiconductor particles. In some configurations, sintering is accompanied by exposure of the substrate material to hydrogen plasma. This procedure has provided unexpected results, as exposure of a Group IV semiconductor nanoparticle layer to excited hydrogen (e.g., atomic hydrogen) during fabrication has been found to provide improved material properties, such as, e.g., improved robustness, reduced porosity and decreased defect density.

Referring now to FIG. 1, a simplified diagram is shown comparing surface area/volume to diameter for a set of Si nanoparticles, in accordance with preferred configurations. Horizontal axis 102 shows Si nanoparticle diameter in nanometers, and vertical axis 103 shows Si surface area/volume in meters$^{-1}$.

In general, Si atoms have an atomic radius of about 0.118 nm and tend to form a diamond crystal structure with a cell dimension of about 0.5431 nm. In addition, although not shown, Ge with an atomic radius of about 0.125 nm and a cell dimension of about 0.566 nm, will have a area/volume to diameter curve that is substantially similar to that of Si.

Below about 4 nm, in the catastrophic contaminating region 104, the surface area/volume ratio increases substantially, from about 1.5 m$^{-1}$ (at about 4 nm) to about 6.0 m$^{-1}$ (at about 1 nm). Eventually, all of the Si atoms are essentially surface or shell atoms, and the likelihood of contamination is extremely high. Thus, for purposes of contamination reduction, the diameter of Group IV nanoparticles should generally be greater than about 4 nm.

Figure 2:
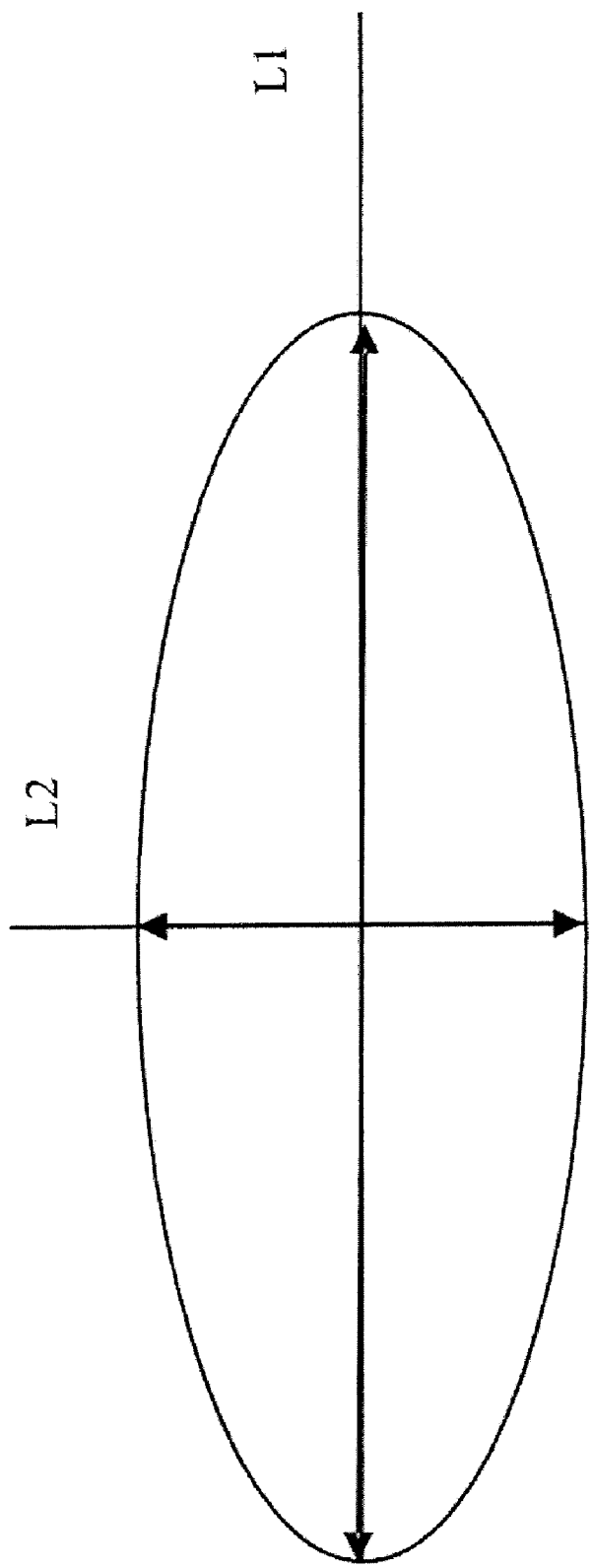
FIG. 2 shows a simplified diagram of sphericity for a Group IV nanoparticle, in accordance with the invention.

Referring now to FIG. 2, a simplified diagram showing sphericity for a Group IV nanoparticle is shown, in accordance with preferred configurations. In general, a metric for particle shape uniformity or sphericity may be obtained by using transmission electron microscopy ("TEM") images. TEM is an imaging technique whereby a beam of electrons is transmitted through a specimen, and an image is formed, magnified and directed to appear either on a fluorescent screen or a layer of photographic film, or detected by a sensor, such as a CCD camera.

Particle sizes may be measured by identifying individual particles and drawing a straight line across a particle's shortest and longest dimensions, as shown in the graphical example. Uniformity may be defined as the ratio of the maximum diameter over the minimum diameter of a particle. By measuring the particle dimension defined as the ratio of the longest dimension L1 over the shortest dimension L2, one can obtain the metric L1/L2 as the level of sphericity. For example, for an ideal spherical particle, uniformity is equal to about 1.0. For an irregular particle, uniformity is generally substantially larger than about 1.0. For example, if a particle is rod or needle shaped, the L1/L2 ratio may be greater than 5. Optimal sphericity is generally between about 1.0 and about 2.0. Aside from surface contamination, a L1/L2 ratio of below 2 is beneficial to nanoparticle application techniques, such as inkjet printing.

Figure 3:
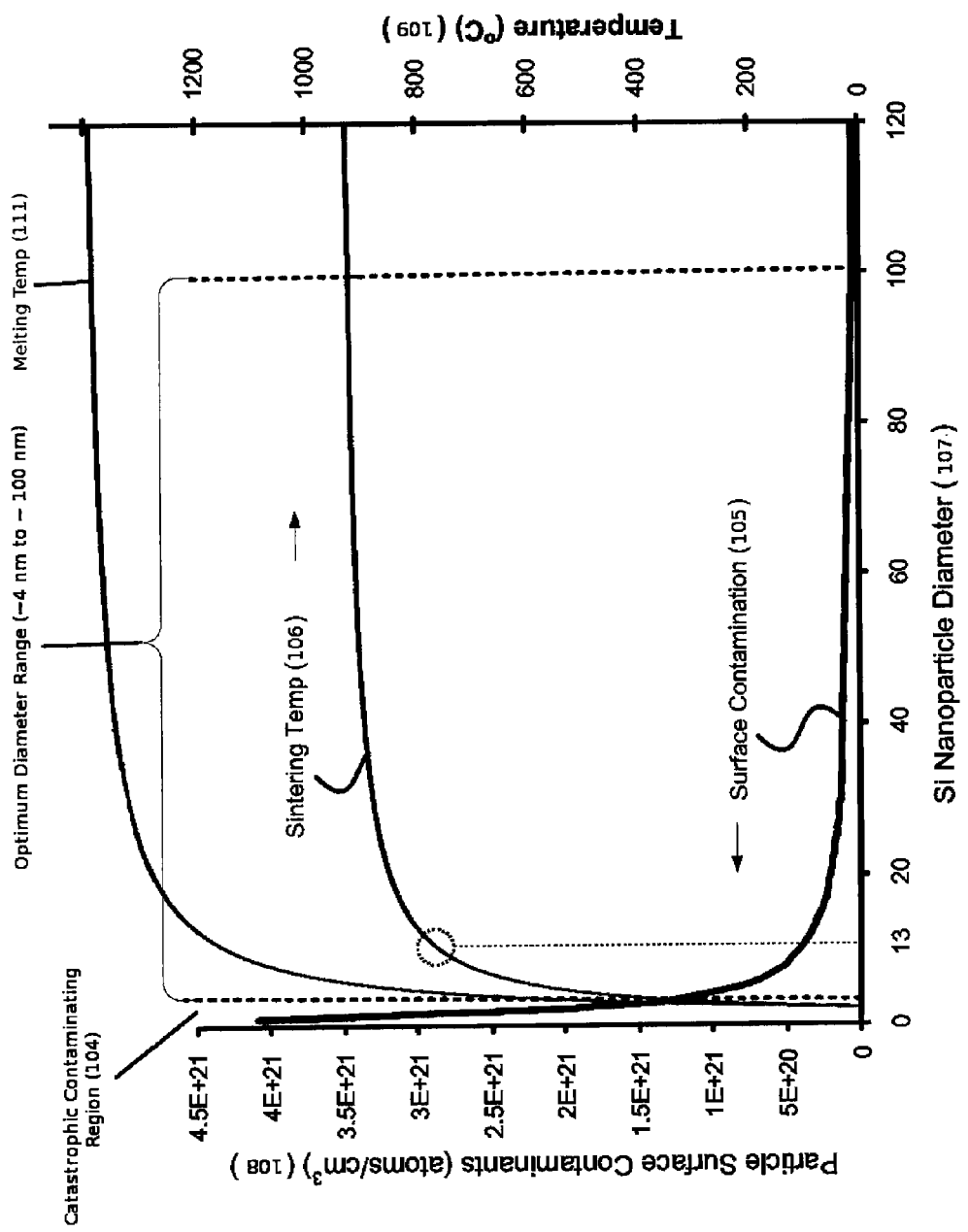
FIG. 3 shows a comparison of surface contamination and melting temperature to diameter for Si nanoparticles, in accordance with the invention.

Referring now to FIG. 3, particle surface contamination 105, sintering temperature 106 and melting temperature 111 are shown as functions of Si nanoparticle diameter 107, in accordance with preferred configurations. The horizontal axis 107 shows Si nanoparticle diameter, the left vertical axis

108 shows particle surface contaminant concentration (atoms/cm$^3$) and the right vertical axis 109 shows temperature in ° C.

At about a 4 nm diameter, Si particle surface contamination is about $1.02 \times 10^{21}$ atoms/cm$^3$, corresponding to a surface area/volume ratio of about 1.5 m$^{-1}$ as previously shown. As the Si particle surface contamination increases above about $1.02 \times 10^{21}$ atoms/cm$^3$ in the catastrophic contaminating region 104, sintering, dense layer formation, and electron-hole recombination are aggravated, as previous stated.

In contrast, below about 13 nm, the sintering temperature of a Si nanoparticle sharply decreases with corresponding decrease in diameter size. Above about 13 nm, it is believed that the sintering temperature increases with an increase in nanoparticle diameter, eventually reaching about 947° C., or about 67% of the melting temperature of Si, which is about 1414° C. The relationship equation is:

$$T_S = T_0\left(1 - \frac{\beta}{d}\right)$$

Where '$T_S$' is the sintering temperature, '$T_0$' is the sintering temperature of Si, '$\beta$' is a constant related to the atomic spacing (approximately 1.88 for Si), and 'd' is the diameter of the nanoparticle.

Likewise, although not shown in the figure, for germanium it is believed that the sintering temperature also gradually increases with a corresponding increase in diameter size, eventually reaching about 628° C., or 67% of the melting temperature of Ge, which is about 938° C.

As previously described, sintering is generally a method for making particles adhere to each other and inducing densification of films. Consequently, because their small radii of curvature, it is believed that nanoparticles generally begin to sinter when a temperature of about two-thirds of the particle melting point is reached. For a given nanoparticles material, smaller nanoparticles generally have a lower sintering temperature than that of larger nanoparticles.

In general, various heat sources may be used to sinter the nanoparticle, such as conventional contact thermal sources (e.g., resistive heaters, etc.), as well as radiative heat sources (e.g., lamps, lasers, microwave processing equipment, plasmas, tungsten-halogen, continuous arc lamps, flash lamps, etc.). In the case of lasers, a wavelength range of between about 0.3 microns and about 10 microns is generally optimal.

In an advantageous manner, lowering the sintering temperature reduces thermally induced stress in the underlying substrate that may subsequently damage the wafer and reduce minority carrier lifetime in photovoltaic applications.

Additionally, a lower sintering temperature also allows the use of alternative materials in or near the junction (i.e., substrate, dielectric layer, etc.) that may have a melting point substantially below the Group IV melting temperature. For example, polymides (e.g., Kapton, Kaptrex, etc.), with a glass temperature of around 400° C., may be used both as a dielectric and as a mask for production of electrical junctions. In addition, lowering the sintering temperature may allow film formation without further diffusion of dopants that are already diffused into or otherwise positioned within the PV cell structure. Consequently, by sufficiently reducing the Group IV nanoparticle diameter (to about 7 nm in this example), a dense nanoparticle layer may be formed on a polymide layer.

Characteristics of Group IV Nanoparticle Colloidal Dispersions (Inks)

Small particles may be more readily suspended in a colloidal dispersion. Because of their small size, nanoparticles tend to be difficult to manipulate. Consequently, in an advantageous manner, assembled nanoparticles may be suspended in a colloidal dispersion (or colloid), such as an ink, in order to transport and store the nanoparticles. The colloidal dispersion defines a formulation of the Group IV nanoparticles used to form the Group IV semiconductor thin films.

Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles.

In general, the Group IV nanoparticles are transferred to a liquid (or solvent) under vacuum, or else an inert, substantially oxygen-free environment, to form the colloidal dispersion (or formulation of the Group IV semiconductor nanoparticles). In addition, the use of particle dispersal methods and equipment, such as sonication, high shear mixers and high pressure/high shear homogenizers, may be used to facilitate dispersion of the nanoparticles in a predetermined solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics, such as, e.g., viscosity, density, polarity and boiling point (temperature).

In addition, in order to better disperse the Group IV nanoparticles in the colloidal dispersion, nanoparticle capping groups may be formed with the addition of capping agents. In some configurations, the capping agents are organic compounds, such as alcohols, aldehydes, ketones, carboxylic acids, esters, and amines, as well as organosiloxanes. Alternatively, capping agents may be added in situ by the addition of gases, such as, e.g., introducing a gaseous capping group into a plasma chamber used to form the nanoparticles. Capping groups may be removed from the nanoparticles during the sintering process or, alternatively, in a lower temperature pre-heat just before the sintering process.

In some configurations, bulky capping agents suitable for use in the preparation of capped Group IV semiconductor nanoparticles include C4-C8 branched alcohols, cyclic alcohols, aldehydes, and ketones, such as, e.g., tertiary-butanol, isobutanol, cyclohexanol, methyl-cyclohexanol, butanal, isobutanal, cyclohexanone, and oraganosiloxanes, such as methoxy(tris(trimethylsilyl)silane) (MTTMSS), tris(trimethylsilyl)silane (TTMSS), decamethyltetrasiloxane (DMTS), and trimethylmethoxysilane (TMOS).

In the case of Group IV nanoparticles, the colloidal dispersions should disperse well in the selected solvents and should preferably easily filter though a 0.5 µm filter, more preferably through a 0.3 µm filter, in order to optimize printability. Typically, the unit of "microns" is used to characterize filters.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

Furthermore, in an advantageous manner, doped nanoparticles may be used as carriers to diffuse dopants into the wafer. A colloidal dispersion of doped nanoparticles may be deposited in a fashion similar to that used for doped glass. Doped glass is typically applied on a silicon wafer using a spray application or a silk-screen—a printing technique wherein a squeegee is used to mechanically force a liquid, such as a highly doped glass paste, onto a substrate. A colloidal dispersion of doped nanoparticles (n-type or p-type) may be deposited on the wafer with an appropriate deposition technique, such as ink jet printing, and then heated to diffuse the dopant into the wafer. Consequently, since the deposited nanoparticles are conductive, in contrast to the processing of doped glass, a buffered oxide etch (BOE) is not required for the removal of the nanoparticles. Thus, a liquid batch process step may be eliminated, improving production yield.

Once formulated, the colloidal dispersion of Group IV semiconductor nanoparticles may be applied to a substrate and subjected to heat treatment (also "annealing" herein) in order to sinter the Group IV nanoparticles into a densified thin film, as discussed in detail below. Examples of application methods include, but are not limited to, roll coating, slot die coating, gravure printing, flexographic drum printing and ink jet printing.

Forming Group IV Semiconductor Nanoparticle Thin Films

Figure 4:
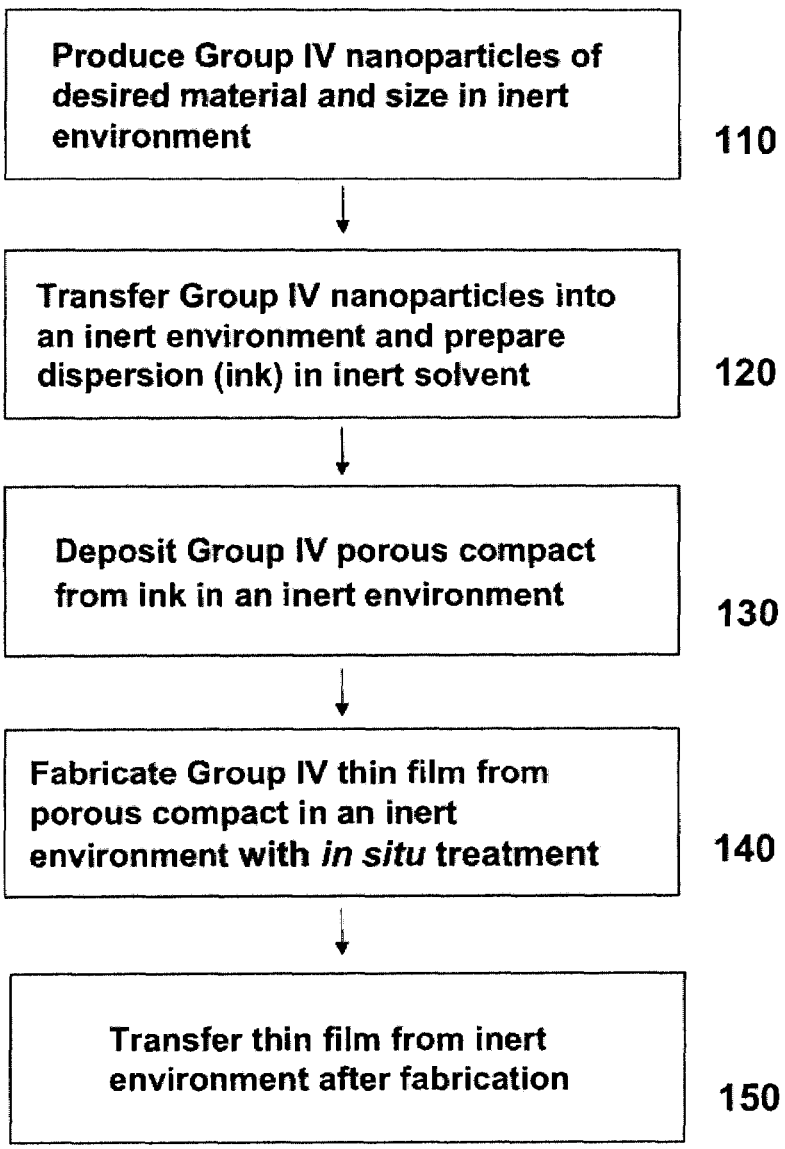
FIG. 4 shows a simplified a flow chart of processing steps for the fabrication of Group IV semiconductor thin films from Group IV semiconductor nanoparticles, in accordance with the invention.

Referring now to FIG. 4, the Group IV semiconductor nanoparticles may be made according to any suitable method, like the methods discussed above. The Group IV semiconductor nanoparticles are preferably formed in an environment that is substantially inert and substantially oxygen-free. As used herein, "inert" is not limited to only substantially oxygen-free. It is recognized that other fluids (i.e., gases, solvents, and solutions) may react in such a way that they negatively affect the electrical and photoconductive properties of Group IV semiconductor nanoparticles.

Additionally, the terms "substantially oxygen-free" in reference to environments, solvents, or solutions refer to environments, solvents, or solutions wherein the oxygen content has been substantially reduced to produce Group IV semiconductor thin films preferably having no more than $10^{18}$ to $10^{20}$ oxygen per cubic centimeter of Group IV semiconductor thin film. For example, it is contemplated that plasma phase preparation of hydrogen-terminated Group IV semiconductor nanoparticles is done in an inert, substantially oxygen-free environment. As such, plasma phase methods produce nanoparticle materials of the quality suitable for making configurations of Group IV semiconductor thin film devices. For example, one plasma phase method, in which the particles are formed in an inert, substantially oxygen-free environment, is disclosed in U.S. patent application Ser. No. 11/155,340, filed Jun. 17, 2005, which is incorporated by reference.

Once the preparation of quality Group IV semiconductor nanoparticles with a desired size and size distribution have been formed in an inert, substantially oxygen-free environment, they are transferred to an inert, substantially oxygen-free solvent (also "dispersion solvent" herein) or solution for the preparation of colloidal dispersions and suspensions of the nanoparticles, or preparation of an ink. The transfer may take place under vacuum or under an inert, substantially oxygen-free environment. In terms of preparation of the dispersions, the use of particle dispersal methods such as sonication, high shear mixers, and high pressure/high shear homogenizers are contemplated for use to facilitate dispersion of the particles in a selected solvent or mixture of solvents. For example, inert dispersion solvents contemplated for use include, but are not limited to chloroform, tetrachloroethane, chlorobenzene, xylenes, mesitylene, diethylbenzene, 1,3,5 triethylbenzene (1,3,5 TEB), silanes, and combinations thereof.

Various configurations of Group IV semiconductor nanoparticle inks can be formulated by the selective blending of different types of Group IV semiconductor nanoparticles. For example, varying the packing density of Group IV semiconductor nanoparticles in a deposited thin layer is desirable for forming a variety of configurations of Group IV photoconductive thin films. In that regard, Group IV semiconductor nanoparticle inks can be prepared in which various sizes of monodispersed Group IV semiconductor nanoparticles are specifically blended to a controlled level of polydispersity for a targeted nanoparticle packing. Further, Group IV semiconductor nanoparticle inks can be prepared in which various sizes, as well as shapes are blended in a controlled fashion to control the packing density.

Additionally, particle size and composition may impact fabrication processes, so that various configurations of inks may be formulated that are specifically tailored to thin film fabrication. This is due to that fact that there is a direct correlation between nanoparticle size and melting temperature. As an example, in FIG. 1, for silicon nanoparticles between the size range of about 1 nm to about 15 nm, the melting temperature is in the range of between about 400° C. to about 800° C. versus the melting of bulk silicon, which is 1420° C. For germanium, nanoparticles of in a comparable size range of about 1 nm to about 15 nm melt at a lower temperature of between about 100° C. to about 400° C., which is also significantly lower than the melting of bulk germanium at about 935° C. Therefore, the melting temperatures of the Group IV nanoparticle materials as a function of size and composition may be exploited in configurations of ink formulations for targeting the fabrication temperature of a Group IV semiconductor thin film.

Another example of what may be achieved through the selective formulation of Group IV semiconductor nanoparticle inks by blending doped and undoped Group IV semiconductor nanoparticles. For example, various configurations of Group IV semiconductor nanoparticle inks can be prepared in which the dopant level for a specific thin layer of a targeted device design is formulated by blending doped and undoped Group IV semiconductor nanoparticles to achieve the requirements for that layer. In still another example are configurations of Group IV semiconductor nanoparticle inks that may compensate for defects in configurations of Group IV photoconductive thin films.

For example, it is known that in an intrinsic silicon thin film, oxygen may act to create undesirable energy states. To compensate for this, low levels of p-type dopants, such as boron difluoride, trimethyl borane, or diborane, may be used to compensate for the presence of low levels of oxygen. By using Group IV semiconductor nanoparticles to formulate configurations of inks, such low levels of p-type dopants may be readily introduced in configurations of blends of the appropriate amount of p-doped Group IV semiconductor nanoparticles with various types of undoped Group IV semiconductor nanoparticles.

Other configurations of Group IV semiconductor nanoparticle inks can be formulated that adjust the band gap of configurations of Group IV photoconductive thin films. For example, the band gap of silicon is about 1.1 eV, while the band gap of germanium is about 0.7 eV, and for alpha-tin is about 0.05 eV. Therefore, formulations of Group IV semiconductor nanoparticle inks may be selectively formulated so that configurations of Group IV photoconductive thin films may have photon adsorption across a wider range of the electromagnetic spectrum. This may be done through formulations of single or mixed elemental composition of silicon, germanium and tin nanoparticles, including alloys, core/shell structures, doped nanoparticles, and combinations thereof. Configurations of such formulations of may also leverage the use of single or mixed shapes and sizes, and combinations thereof, as well as a single form of crystallinity or a range or mixture of crystallinity, and combinations thereof.

Still other configurations of inks can be formulated from alloys and core/shell Group IV semiconductor nanoparticles. For example, it is contemplated that silicon carbide semiconductor nanoparticles are useful for in the formation of a variety of semiconductor thin films and semiconductor devices. In other configurations, alloys of silicon and germanium are contemplated. Such alloys may be made as discrete alloy nanoparticles, or may be made as core/shell nanoparticles.

After the formulation of an ink, the steps of depositing a thin film of Group IV semiconductor nanoparticles 130, and fabricating the film into Group IV semiconductor thin film using in situ processing 140 are done. In step 130 of FIG. 4, using an configuration of an ink formulation, a thin film of Group IV semiconductor nanoparticles is deposited on a solid support, which thin film is referred to as a green film or porous compact. It is contemplated that a variety of deposition techniques are suitable for the deposition of the dispersion of Group IV nanoparticles on a substrate. As an example, and without limitation, various configurations of ink formulations may be suitable for use with roll coating, slot die coating, gravure printing, flexographic drum printing, and ink jet printing methods, or combinations thereof.

The term "in situ" generally refers to the processing of a Group IV semiconductor nanoparticle layer or thin film in a process chamber or, generally, a reaction space configured for thin film fabrication. The process chamber has a chamber pressure that is maintained as desired. The process chamber is generally configured to bring the substrate and an overlying Group IV semiconductor nanoparticle layer or thin film in contact with various gases (also "vapors" herein). Additionally, the process chamber is configured to enable heating and cooling of a Group IV semiconductor nanoparticle layer or thin film over a substrate.

In some configurations, the process chamber comprises a computer system to monitor and control the pressure of the process chamber, the flow rate of one or more gases into the process chamber, the temperature of a Group IV semiconductor nanoparticle layer or thin film over a substrate in the process chamber, and plasma generator parameters, such as, e.g., plasma power. The computer system may be configured to enable batch fabrication of Group IV semiconductor thin films.

In one aspect of in situ processing, Group IV semiconductor nanoparticles are coated with an oxide layer. Such a coating may be useful for dispersion of the nanoparticles in selected solvents, as well as for promoting stability during storage either as bulk solid or in ink formulations. In order to fabricate Group IV semiconductor thin films from such coated Group IV nanoparticle ink dispersions, the coating is removed using in situ processing during thin film fabrication.

Referring now to FIGS. 5A-5C, a set of simplified cross-sectional side views of thin films are shown in which the processing of coated Group IV emiconductor nanoparticles is schematically depicted, in accordance with the invention.

In FIG. 5A, a configuration of a porous compact 17 deposited using Group IV semiconductor nanoparticles and having a coating layer 15 around nanoparticles 16 is shown. In general, during the processing of configurations of porous compact 17 to thin film 19, in situ processing may be done to remove the coating 15, allowing a porous compact 18 of Group IV nanoparticles to be formed, as shown in FIG. 5B. In FIG. 5C, a Group IV semiconductor thin film 19 having known properties is formed from the Group IV semiconductor porous compact 18.

In FIGS. 5A-5C, a substrate 10, upon which a first electrode, 14, and optionally an insulating layer 12 between the substrate 10 and electrode 14 are deposited, is depicted. For the fabrication of some configurations of a thin film 19, substrate materials may be selected from silicon dioxide-based substrates. Such silicon dioxide-based substrates include, but are not limited to, quartz and glasses, such as soda lime and borosilicate glasses. Silicon substrates are also considered as substrates for the formation of a thin film 19, where a range of silicon substrates, such as prime grade (e.g., single crystal silicon), multicrystalline, to metallurgical grade are useful for fabricating a variety of configurations of thin film 19. Alternatively, stainless steel and heat-durable polymers (such as polyimides and aromatic fluorene-containing polyarylates), may be used.

The first electrode 14 may be selected from conductive materials, such as, for example, metals or combinations of metals selected from the group consisting of aluminum, molybdenum, chromium, titanium, nickel, platinum, and stainless steel. In general, the first electrode 14 is between about 10 nm to about 1000 nm in thickness. Optionally, an insulating layer 12 may be deposited on the substrate 10 before the first electrode 14 is deposited. Such an optional layer is useful when the substrate is a dielectric substrate, since it protects the subsequently fabricated Group IV semiconductor thin films from contaminants that may diffuse from the substrate into the Group IV semiconductor thin film during fabrication.

When using a conductive substrate, the insulating layer 12 not only protects Group IV semiconductor thin films from contaminants that may diffuse from the substrate, but is required to prevent shorting. Additionally, the insulating layer 12 may be used to planarize an uneven surface of a substrate. Finally, the insulating layer may be thermally insulating to protect the substrate from stress during some types of processing, such as, for example, when using lasers to heat the thin film 19. The insulating layer 12 may be selected from dielectric materials such as, for example, silicon nitride, alumina and silicon oxides. Additionally, layer 12 may act as a diffusion barrier to prevent the accidental doping of the active layers. For various configurations of photoconductive devices contemplated, the insulating layer 12 has a thickness between about 5 nm to about 100 nm.

In the absence of in situ processing, the step of fabrication of configurations of Group IV semiconductor thin film 19 in FIG. 5C from configurations of Group IV semiconductor nanoparticles 18 in FIG. 5B is done in an inert, substantially oxygen free environment using temperatures between about 100° C. and about 1000° C., depending on the nature of the Group IV semiconductor nanoparticle, and fabrication process parameters, as will be discussed in more detail below. Thin films may be processed in inert environments using one or more noble gases (e.g., He, Ar), nitrogen, or mixtures thereof, or they may be processed in a vacuum (i.e., in vacuo). Additionally, to create a reducing atmosphere, up to 20% by volume of hydrogen may be mixed with the one or more noble gases, nitrogen, or mixtures thereof. Though as previously discussed, "inert" is not limited in meaning to substantially oxygen free, one metric of an inert environment includes reducing the oxygen content so that the Group IV semiconductor thin films have any oxygen concentration no more than about $10^{18}$ to $10^{20}$ atoms per cubic centimeter of Group IV semiconductor thin film.

Heat sources contemplated for use include conventional contact thermal sources, such as resistive heaters, as well as radiative heat sources. Such radiative heating sources include, for example, lamps, lasers, microwave processing equipment, and plasmas. More specifically, radiative heating sources include tungsten-halogen, continuous arc lamps, and flash lamps. For example, noble gas flash lamps, such as xenon, argon, neon, and the like, are exemplary of radiative lamp sources, as well as lasers operating in the wavelength range between about 0.3 micron to about 10 micron, and microwave processing equipment operating in even longer wavelength ranges. All of these exemplary radiative heating sources are matched to the fabrication requirements of Group IV semiconductor thin films described herein, both by virtue of attributes such as the wavelength, as well as the penetration depth.

With respect to factors affecting the fabrication of a deposited Group IV nanoparticle thin film into a densified thin film, the time required varies as an inverse function in relation to the fabrication temperature. For example, if the fabrication temperature is about 800° C., then for various configurations of Group IV photoconductive thin films, the fabrication time may be, for example, between about 0.25 minutes to about 15 minutes. However, if the fabrication temperature is about 400° C., then for various configurations of Group IV photoconductive thin films, the fabrication temperature may be between about, for example, 5 minutes to about 10 hours. Optionally, the fabrication process may be performed at a pressure of up to about 500 atm. The fabrication of Group IV semiconductor thin films from Group IV semiconductor nanoparticle materials has been described in U.S. Patent App. No. 60/842,818, filed Sep. 7, 2006, entitled, "Semiconductor Thin Films Formed from Group IV Nanoparticles," which is incorporated by reference.

Regarding the coating 15 of FIG. 5A, one coating contemplated for use, and removed using in situ processing during Group IV semiconductor thin film fabrication from Group IV semiconductor nanoparticles, is an oxide layer. As previously discussed, Group IV semiconductor nanoparticles are highly reactive, and react with a number of species, such as oxygen and water, to promote the formation of an oxide layer. It has been observed that even under conditions considered inert for one of ordinary skill in the art accustomed to the handling air-sensitive materials that a thin oxide layer may nonetheless form on the Group IV semiconductor nanoparticles. This may be obviated by using more scrupulous conditions for excluding and scrubbing sources of oxygen in order to ensure that there is no more than about $10^{18}$ to about $10^{20}$ of oxygen per cubic centimeter of a Group IV semiconductor thin film, as previously discussed.

Alternatively, under inert conditions, a thin film of a silicon oxide film may be allowed to form as a coating over Group IV semiconductor nanoparticles by controlling the concentration and time of exposure to an oxygen source. Such a thin film may not only provide stability for the Group IV semiconductor nanoparticles, but may allow dispersion of such particles in selected types of solvents, such as, e.g., organic solvents. Organic solvents include, without limitation, aromatic and aliphatic alcohols, ketones, aldehydes, ethers, and mixtures thereof.

Figure 6B:
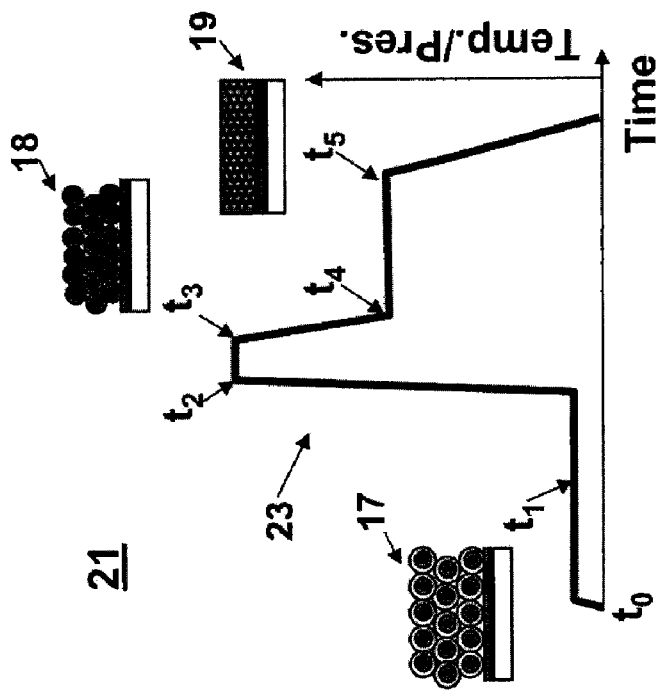
FIGS. 6A-6B show simplified temperature and pressure profiles as a function of time for the in situ fabrication of Group IV semiconductor thin films from Group IV semiconductor nanoparticles using HF, in accordance with the invention.
Figure 6A:
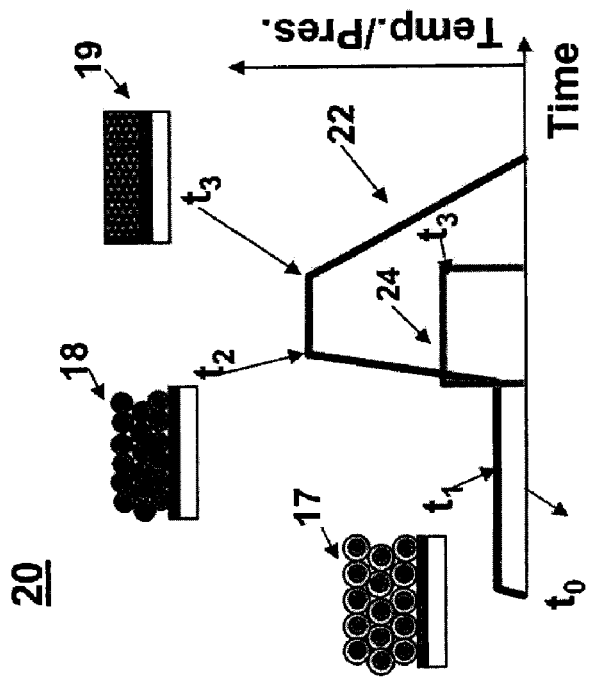

In the configurations of FIGS. 6-8, $t_y$ (wherein 'y' is a number greater than or equal to one) refers to a process time. For example, in FIG. 6A, $t_2$ is the time at which the targeted fabrication temperature is reached. Moreover, time intervals may be indicated by $t_a$-$t_b$, wherein $t_a$ and $t_b$ are times on the temperature and pressure profiles illustrated in FIGS. 6-8. As another example, in FIG. 6A, $t_2$-$t_3$ designates the time interval between times $t_2$ and $t_3$. It addition, in the temperature and pressure profiles illustrated in FIGS. 6-8, all of the indicated times are associated with a particular temperature and pressure.

Referring now to FIGS. 6A-6B, a set of simplified diagrams of in situ processes for the removal of an oxide layer from Group IV semiconductor nanoparticles and thin films are shown, in accordance with the invention. In the configuration of an in situ treatment shown in FIG. 6A, process 20 is an in situ chemical vapor etching process to remove the oxide coat during the fabrication of a Group IV semiconductor thin film. In another configuration of an in situ process 21, depicted in FIG. 6B, the oxide layer may be removed by increasing the temperature of the porous compact formed from oxide capped Group IV semiconductor nanoparticles in vacuo.

In addition, hydrofluoric acid (HF) chemical vapor etching may be used to process the in situ removal of an oxide layer formed on porous compact 17, in accordance with the invention. In general, in addition to the removal of the oxide layer, the HF treatment leaves the surface of the Group IV semiconductor nanoparticles or thin films hydrogen-terminated, which is desirable for stability and performance.

Regarding the fabrication time and temperature, during a process phase that includes time $t_1$, a conditioning step is performed at a conditioning temperature. Such a conditioning step may be useful for driving off volatile chemical species, such as solvent, as well as assisting in making the porous compact 17 more mechanically stable. Such a step may be done for about ten seconds to about one hour, and between conditioning temperatures of about 30° C. and about 300° C. in an inert environment, for example, either in the presence of an inert gas, or in vacuo.

After the conditioning step at $t_1$, the temperature may be ramped to a targeted fabrication temperature at $t_2$ for the thermal processing of Group IV semiconductor nanoparticle porous compact 18 to Group IV semiconductor thin film 19, and held (also "maintained" herein) at the fabrication temperature for the time interval $t_2$-$t_3$. The processing temperature for the fabrication of a Group IV semiconductor thin film from Group IV semiconductor nanoparticles may be between about 300° C. and about 1350° C., the selection of which is taken in consideration of the fabrication time, which may be between about 1 nanosecond (using, e.g., a flash or laser source) and about 10 minutes.

Several configurations of HF treatment for the in situ removal of an oxide layer on Group IV semiconductor nanoparticles, as shown in FIG. 6A, are contemplated. HF process profile 24 indicates an configuration of a process profile for the in situ treatment of the device to HF. The HF treatment may be done by exposure of a Group IV semiconductor porous compact to vapors from an aqueous solution of HF or may be done in the vapor phase using anhydrous HF ("AHF") in conjunction with mixtures of other vapors.

For example, in FIG. 6A, just at the end of the conditioning step and before reaching the targeted fabrication temperature at $t_2$, the porous compact 19 made of particles having an oxide layer could be exposed to vapors from an aqueous solution saturated with HF. Such solutions are about 49% (w/w) HF. For example, in FIG. 5A, a 1"×1" quartz substrate 10, coated with molybdenum layer 14 of about 100 nm, having a porous compact 19 of about 1 micron in thickness of Group IV semiconductor nanoparticles, may be placed in a small processing chamber ("chamber").

The chamber (or reaction space) may be either a material having a fluorohydrocarbon coating, or of a ceramic material, with a volume of between about 50 cc to about 500 cc, in which vapors from a solution of 49% (w/w) HF in water have been allowed to equilibrate. Exposure of such a sample to the aqueous HF vapors may be between about 30 seconds to about 20 minutes at chamber temperatures of between about 25° C. to about 60° C.

Alternatively, anhydrous HF (AHF) vapor with a controlled amount of vapor from a low molecular weight protic solvent, such as water or a low molecular weight alcohol, such as methanol or ethanol, is allowed to flow into the fabrication chamber. The composition of such vapors can vary widely, where the vapor pressure of AHF may be between about 1 Torr to about to 20 Torr, while the ratio of partial pressure of the vapors from the protic solvent to that of AHF may be range between about 0.02 to about 0.7 Generally, the higher the amount of AHF vapor to that of the protic solvent (i.e., the lower the ratio of protic solvent vapor to AHF vapor), the faster the etch rate.

Additionally, the etch rate is impacted by the temperature at which the vapor etching is done. Given the reactivity of AHF, vapor etching may be performed at a temperature between about 25° C. to about 60° C. For configurations in which the exposure of a Group IV semiconductor thin film to vapors from an aqueous HF solution, or in which controlled vapor is used for etching, the conditions for etching can be optimized by observing the change in contact angle going from a high surface energy oxide to a low surface energy semiconductor material.

In addition, HF may be introduced at a temperature below the targeted thermal processing temperature. In alternative configurations of thin film fabrication 20, the onset of the introduction of the HF vapor may occur at various times during thin film fabrication. In some configurations, the HF vapor may be introduced before any thermal processing is initiated in order to effectively etch the oxide layer from Group IV semiconductor nanoparticles in a porous compact 17.

Alternatively, the HF vapor may be introduced in the interval of the conditioning portion of the ramp, or it may be introduced in the thermal processing step after densification has progressed. In addition, process profile 24 may be further optimized by varying the time of introduction of the HF vapor, the total time of exposure of the thin films to the vapor, the temperature of the processing profile that overlaps the HF exposure, and the partial pressure of the HF vapor in the processing gas.

Referring now to FIG. 6B, an alternate configuration for the removal of an oxide layer from Group IV semiconductor nanoparticles is shown, in accordance with the invention. In general, after a conditioning step $t_1$, as discussed above, the thin film is formed in vacuo at a pressure between about $1 \times 10^{-7}$ Torr and about $1 \times 10^{-4}$ Torr. The temperature may be increased (also "ramped" herein) to between about 300° C. and about 1350° C. at time $t_2$ and held for a short duration of between about 1 nanosecond (using, e.g., a flash or laser source) and about 10 minutes, and maintained at this temperature (first fabrication temperature) until process time $t_3$. In the $t_2$-$t_3$ time interval, the oxide layer decomposes and the thin film forms. In the case of silicon, the oxide layer is believed to be removed as $SiO_{(g)}$.

During this high temperature interval, the thermal processing of a porous compact 18 to a thin film 19 is initiated, and is completed during a lower temperature (second fabrication temperature) time interval $t_4$-$t_5$, which can be of longer duration than the high temperature interval $t_2$-$t_3$. This interval may be performed at a temperature between about 300° C. and about 800° C. for a time period up to about 30 minutes. For either process 20 of FIG. 6A or process 21 of FIG. 6B, at the end of the process profile after the Group IV semiconductor thin film 19 has been formed, the thin film may be removed from the inert processing environment, as indicated in process step 150 of FIG. 4.

Referring now to FIGS. 7A-7B, in situ processes for the removal of an oxide layer from Group IV semiconductor nanoparticles during the formation of a variety of Group IV semiconductor thin films are shown, in accordance with the invention. In these representations, the temperature of the porous compact 17 with core Group IV semiconductor material 16 may be increased rapidly, so that at a targeted processing temperature at $t_2$ the Group IV semiconductor core material has reached a state 16' in which thin film sintering or complete densification can occur while the coating 15 of FIG. 5A remains intact.

Just after the Group IV semiconductor core material 16 has equilibrated at the desired temperature at $t_2$, the chamber pressure may be dropped precipitously at time $t_{2+x}$, preferably between about 1 and about 7 order of magnitude in relation to the initial chamber pressure, more preferably between about 1 and about 5 orders of magnitude in relation to the initial chamber pressure. In this regard, at the designated high temperature and low pressure, the coating 15 of FIG. 5A, such as the oxide layer of silicon nanoparticles, will be rapidly desorbed from the exterior of the nanoparticles 16' that have equilibrated to a thin film sintering or densification temperature set at $t_2$, allowing thin film formation to proceed to an intermediate state of a sintered or fully densified thin film 18 upon the desorption of coating 15 of FIG. 5A. Finally, at the end of the processing, a sintered or fully densified thin film 19 has been formed.

Referring now to FIG. 7A, a simplified time/temperature profile for fabrication process 30 is shown, in accordance with the invention. As for the initial phase of processing described for FIG. 6A, at $t_1$ the portion of the process shown in FIG. 7A is a conditioning step performed at a conditioning temperature, initiating temperature profile 32. After the conditioning step at $t_1$, the temperature may be increased (also "ramped" herein) to the targeted fabrication temperature at $t_2$ for the thermal processing of Group IV semiconductor nanoparticle porous compact 17'. The fabrication temperature may be between about 300° C. and about 1350° C. At the targeted fabrication temperature $t_2$ the nanoparticle core 16' has been equilibrated to a temperature at which the Group IV semiconductor core can be processed to an intermediate state of a sintered or fully densified thin film 18 once the coating 15 of FIG. 5A has been desorbed. It is contemplated that the target process temperature set at $t_2$ will vary as a function of the size of Group IV semiconductor nanoparticles, as well as by the material type, as previously mentioned.

For example, for silicon nanoparticles sizes between about 1 nm and about 10 nm, the targeted processing (or fabrication) temperature may be between about 300° C. and about 800° C., while for silicon nanoparticles sizes between about 11 nm and about 20 nm, the target processing temperature will be between about 900° C. and about 1100° C. Additionally, for germanium nanoparticles of the same size ranges, the targeted processing temperature would be shifted down in relation to that for silicon nanoparticles.

As depicted in chamber pressure profile 34, at the target process temperature $t_2$, there is a delay of a time "x" between allowing the Group IV semiconductor nanoparticles to equilibrate to the state 16' and initiating the decrease in the chamber pressure at time $t_{2+x}$. Factors affecting the time it would take for nanoparticles 16 to equilibrate to the nanoparticles of 16' include, but are not limited to, the porous compact thickness, the nature of the processing environment (e.g., whether processing is performed in the presence of inert gas or in vacuo), and the heat source used for processing (e.g., flash lamp, laser, or tungsten-halogen lamp). It is contemplated that the delay in dropping the chamber pressure at $t_{2+x}$ can be up to about a minute for the exemplary heat sources provided above.

With respect to chamber pressure, though in some configurations the processing could be initiated at atmospheric pressure in an inert gas environment, it is contemplated that for other configurations, an initial chamber pressure of between about $10^{-2}$ Torr and about $10^{-4}$ Torr is indicated. At time $t_{2+x}$ the chamber pressure would be dropped to between about $10^{-5}$ Torr to about $10^{-7}$ Torr in a time interval of between about $10^{-3}$ sec to 5 sec Under these conditions, the coating layer 15 of FIG. 5 is removed, and the intermediate state of a sintered or fully densified thin film 18 is formed. Finally, intermediate state is fully processed to form Group IV semiconductor thin film 19.

Still another example for the removal of an oxide layer from Group IV semiconductor nanoparticles is shown in process 31, depicted in FIG. 7B. In this exemplary configuration, after a conditioning step $t_1$, as discussed above, the temperature is rapidly increased to a first fabrication temperature at $t_2$ for an interval between $t_2$ and $t_3$ for temperature profile 33 in order to facilitate the transformation of the Group IV semiconductor nanoparticles to the Group IV semiconductor thin film. The temperature may be ramped to between about 500° C. and about 1350° C. at time $t_2$ for a time interval ($t_2$-$t_3$) of between about $1\times10^{-2}$ seconds and about $1\times10^{-4}$ seconds.

With respect to chamber pressure profile 35, though the chamber pressure may be held at atmospheric in an inert gas for some configurations of process 31, for other configurations of process 31, the chamber pressure is held at between about $1\times10^{--2}$ Torr and about $1\times10^{-4}$ Torr. Then at time $t_{2+x}$ the pressure is dropped to between about $10^{-5}$ Torr to about $10^{-7}$ Torr in a time interval of between about $10^{-3}$ sec to about 5 sec. Under these conditions, the coating layer 15 of FIG. 5 is removed, and the intermediate state of a sintered or fully densified thin film 18 is formed. In the configuration of thin film process 31 depicted in FIG. 7B, the thermal processing of porous compact 18' to thin film 19 completed during a lower temperature (second fabrication temperature) interval between $t_4$-$t_5$, which is of longer duration than the high temperature step.

This interval may be between about 300° C. and about 800° C. for up to about 30 minutes. For either process 30 of FIG. 7A or process 31 of FIG. 7B, at the end of the process profile, after Group IV semiconductor thin film 19 has been formed, the thin film may be removed from the inert processing environment, as indicated in process step 150 of FIG. 4.

Referring now to FIGS. 8A-8B, a set of simplified diagrams of configurations for the in situ hydrogen passivation of Group IV semiconductor thin films is shown as processes 40 and 41, in accordance with the invention. In FIGS. 8A-8B, the thermal profiles 42 and 43, respectively, are the same as those described in FIG. 6A and FIG. 6B for the thermal profiles 22 and 23, respectively. In FIGS. 8A-B, at the time interval $t_3$-$t_4$, the fabrication temperature (FIG. 8A) or first fabrication temperature (FIG. 8B) may be between about 300° C. and 1350° C., and the $t_3$-$t_4$ time interval may be between about 1 nanosecond and 10 minutes. In FIG. 8B, heating during the $t_5$-$t_6$ time interval may be performed at a temperature and time interval as described above in the context of the second fabrication temperature (time interval $t_4$-$t_5$) of FIG. 6B.

Configurations of in situ hydrogen passivation of Group IV semiconductor thin films include the use of hydrogen plasma processing. A hydrogen partial pressure is indicated for hydrogen partial pressure profiles 44 and 45 of FIG. 8A and FIG. 8B, respectively. As noted in the processing profiles, the hydrogen partial pressure may be increased during the preconditioning step at $t_2$ before the thermal ramp from a lower conditioning temperature to the targeted thermal processing temperature at $t_3$.

Referring to FIG. 8A, this targeted thermal processing temperature is also referred to as the fabrication temperature. In FIG. 8B, this targeted thermal processing temperature is also referred to as a first fabrication temperature; further processing is performed at a second fabrication temperature in the time $t_5$-$t_6$ time interval. In general, this gives sufficient time for hydrogen to diffuse through the porous compact 17, which may drive out untoward gases, such as oxygen. Additionally, hydrogen acts as a processing aid in the formation of Group IV semiconductor thin films. In an alternative configuration, the hydrogen partial pressure may be increased before $t_2$. In such a case, plasma generation would start upon application of power to the plasma generator. The hydrogen partial pressure may be maintained during the cool-down step, even after the formation of the Group IV semiconductor thin film 19, to ensure that the hydrogen passivation is at the highest effective level in the Group IV semiconductor thin film 19.

The application of the plasma is indicated by the hatched lines 46' and 46" of FIG. 8A and 47', and 47" of FIG. 8B. In some configurations of in situ hydrogen passivation of Group IV semiconductor thin films, the plasma may be initiated before the thermal ramp that occurs at $t_3$, as indicated by exemplary profiles 46' and 47', of FIG. 8A and FIG. 8B, respectively. Alternatively, the plasma may be initiated after the thermal ramp that occurs at $t_3$, as indicated by exemplary profiles 46" and 47", of FIG. 8A and FIG. 8B, respectively. For example, in a processing chamber having a volume of between about 200 to about 250 liters, hydrogen at between about 100 standard cubic centimeters per minute ("sccm") and about 250 sccm, optionally mixed with argon at between about 40 sccm and about 60 sccm, is used to charge the chamber to a pressure of between about 0.08 Torr and about 0.80 Torr. The plasma is initiated and maintained using a power of between about 1000 Watts and about 4000 Watts.

Before thin film fabrication, the nanoparticles may be cleaned upon exposure of the nanoparticles to hydrogen plasma, which brings the nanoparticles in contact with excited species of hydrogen (e.g., atomic hydrogen). A hydrogen plasma is struck, preferably at a temperature below which hydrogen desorbs from the nanoparticles, more preferably at a temperature below which hydrogen is fully desorbed from the nanoparticles. In one configuration, the nanoparticles are exposed to the hydrogen plasma at a temperature below about 600° C.

As an example, in FIG. 8A, the nanoparticles may be exposed to the hydrogen plasma at time $t_1$ or $t_2$. Exposure of the nanoparticles to the hydrogen plasma removes impurities, such as carbon, nitrogen and oxygen-containing impurities, from the surfaces of the nanoparticles. As an example, exposure of the nanoparticles to the hydrogen plasma removes any atomic oxygen or water from the surfaces of the nanoparticles. Surface sites that are made available upon removal of surface impurities are occupied by atomic hydrogen. During exposure of the nanoparticles to the hydrogen plasma, hydrogen may diffuse into the nanoparticles.

Exposure of the nanoparticles to hydrogen plasma may aid in the sintering process at elevated temperatures. Accordingly, in some configurations, hydrogen plasma is also a sintering aide. In one configuration, the Group IV semiconductor nanoparticles are exposed to hydrogen plasma before increasing the temperature to the fabrication temperature (FIG. 8A) or first fabrication temperature (FIG. 8B). In another embodiment, the Group IV semiconductor nanoparticles are exposed to hydrogen plasma during the temperature ramp to the fabrication temperature (FIG. 8A) or first fabrication temperature (FIG. 8B). In yet another embodiment, the Group IV semiconductor nanoparticles/thin film (i.e., during transition from the nanoparticles to the thin film) are exposed to hydrogen plasma while at the fabrication temperature (FIG. 8A) or first fabrication temperature (FIG. 8B) and/or second fabrication temperature (FIG. 8B). In still another embodiment, the Group IV semiconductor thin film may be exposed to hydrogen plasma during cool down from the fabrication temperature (FIG. 8A) or cool down from the first fabrication temperature (FIG. 8B) and/or cool down from the second fabrication temperature (FIG. 8B).

In an alternative configuration, prior to exposure of the Group IV semiconductor nanoparticles to hydrogen plasma, the nanoparticles may be oxidized to form an outer silicon oxide ($SiO_x$, wherein x is between about 1 to about 2) layer over silicon. Oxidation may be accomplished by exposing the nanoparticles to oxidizing agents, such as, for example, $O_2$, $H_2O$, $O_3$ and $NO_2$. Oxidation of the nanoparticles is performed with or without heating, and preferably at a temperature below the thin film fabrication temperature. The nanoparticles may thereafter be processed according to the methods illustrated in FIGS. 8A-8B. As an example, in FIG. 8A, at $t_1$ $O_2$ is directed into the processing chamber to oxidize the surfaces of the nanoparticles. At $t_2$ hydrogen plasma is generated in the processing chamber by directing hydrogen into the processing chamber while simultaneously applying power to the plasma generator. Next, the substrate temperature may be increased to the thin film fabrication temperature at $t_3$, the substrate is maintained at that temperature until $t_4$, and the substrate may be cooled to room temperature. Plasma generation may be terminated at any point during or after cool-down from the fabrication temperature.

Upon increasing the temperature to predetermined fabrication temperatures, as per process 40 of FIG. 8A, hydrogen may desorb from the surfaces of the nanoparticles. Optionally, during cool-down from the fabrication temperature, the Group IV semiconductor thin film may be exposed to hydrogen plasma to remove any impurities from the surfaces of the thin film while simultaneously filling thin film surface sites with atomic hydrogen.

Hydrogen may be directed into the processing chamber with our without an inert gas. In one configuration, hydrogen may be directed into the processing chamber without an inert gas. In another configuration, hydrogen may be directed into the processing chamber with an inert gas, such as, e.g., He or Ar. The hydrogen pressure and flow rate are adjusted as required to optimize thin film properties. Furthermore, the hydrogen flow rate, chamber pressure and thin film temperature can be maintained and adjusted using a control system, such as a computerized control system.

The term "hydrogen plasma" generally refers to plasma-excited species of hydrogen. Plasma-excited species of hydrogen include radicals, ions, or other excited species of hydrogen generated via application (or coupling) of energy to hydrogen gas ($H_2$). Energy may be applied via a variety of methods, such as, e.g., induction, ultraviolet radiation, microwaves and capacitive coupling. The plasma generator may be a direct plasma generator (i.e., in situ plasma generation) or a remote plasma generator (i.e., ex situ or remote plasma generation). In the absence of coupling energy, plasma generation is terminated. Plasma-excited species include, without limitation, hydrogen radicals (or atomic hydrogen), hydrogen cations ($H^+$, $H_2^+$) and hydrogen anions ($H^-$, $H_2^-$).

In addition, "exposure" of a substrate to hydrogen plasma brings one or more exposed surfaces of the substrate and any material layers deposited on the substrate in contact with excited species of hydrogen. As an example, in FIG. 5A, if the substrate 10 having the porous compact 17 of Group IV semiconductor nanoparticles thereon may be exposed to hydrogen plasma, exposed surfaces of the compact 17 and the substrate 10 will be contacted by excited species of hydrogen.

Alternative configurations for cleaning Group IV semiconductor nanoparticles will be discussed. While preferred configurations are applied for the removal of oxygen-containing impurities, such as atomic oxygen, it will be appreciated that preferred methods can be used to remove carbon, nitrogen and sulfur-containing impurities.

In one configuration, the Group IV semiconductor nanoparticles may be cleaned prior to thin film fabrication at a predetermined sintering temperature by contacting the nanoparticles with a chemical etchant. The chemical etchant is preferably more reactive with silicon oxide ($SiO_x$, wherein 'x'=1, 2) than Si. In configurations, the chemical etchant removes silicon oxide at a rate preferably greater than about 5 times the rate at which the chemical etchant removes Si, more preferably greater than about 15 times the rate at which the chemical etchant removes Si, and most preferably greater than about 35 times the rate at which the chemical etchant removes Si. The chemical etchant is preferably selected from the group consisting of $C_xH_yG_z$ (wherein 'x'>0, 'y'≧0 and 'z'>0 and 'G' includes one or more halogens, such as, F, Cl, I, or combinations thereof), $SF_6$, $SiF_6$, $NF_3$ and $XeF_3$. As an example, the chemical etchant may be $CF_4$. As another example, the chemical etchant may be $CHF_3$.

The chemical etchant may be directed into the processing chamber with hydrogen ($H_2$). The chemical etchant and hydrogen may be directed into a mixing chamber before being directed or fed into the processing chamber. The partial pressures and flow rates of the chemical etchant and hydrogen are selected to optimize Group IV semiconductor thin film properties, such as density, porosity and conductivity.

The Group IV semiconductor nanoparticles may be contacted with the chemical etchant at a temperature greater than about 300° C. and less than the thin film fabrication (sintering) temperature. In an exemplary configuration, with the nanoparticles contacted with the chemical etchant and hydrogen mixture, the temperature may be increased (or ramped) to the fabrication temperature. Plasma power is preferably applied either before the temperature ramp, during the temperature ramp, or after the temperature ramp to the fabrication temperature. As an example, in FIG. 8A, at $t_2$, a chemical etchant and hydrogen are introduced into the processing chamber; the temperature may be increased to the fabrication temperature at $t_3$; the fabrication step is terminated at $t_4$; and the temperature is subsequently decreased. Plasma power may be applied at any point between $t_2$ and $t_4$ to contact the nanoparticles with excited species of hydrogen and the chemical etchant.

Application of plasma power may also generate excited species of the chemical etchant. In one configuration, the flow of the chemical etchant into the processing chamber is terminated before increasing the temperature to the fabrication temperature. In another configuration, the flow of chemical etchant into processing chamber is terminated while the temperature is maintained at the fabrication temperature. In still another configuration, the flow of the chemical etchant into the processing chamber is terminated during cool-down from the fabrication temperature. In some configurations, the flow of the chemical etchant is controlled independently from the flow of hydrogen into the processing chamber. As an example, with the processing chamber backfilled with hydrogen and before increasing the temperature to the fabrication temperature, the chemical etchant is introduced into the processing chamber.

In addition, oxygen removal from Group IV semiconductor nanoparticle surfaces may be performed at room temperature using one or more halogen-containing compounds, $A_xB_z$, wherein 'A' and 'B' are halogens (e.g., F, Cl, Br, I), and 'x' and 'y' are numbers greater than or equal to zero, under the condition that if 'x' is zero, 'y' is not zero, and vice versa. In some configurations, processing is performed without plasma generation, thus leading to decreased processing costs. The reaction between a halogen-containing compound and silicon oxide preferably occurs at a much higher rate than the reaction between the halogen-containing compound and silicon. Halogen-containing compounds include, without limitation, $F_2$, $Cl_2$, $Br_2$, $IF_5$, $ClF_3$, $BrF_3$, $BrF_5$. Halogen-containing species will remove metallic impurities from the Group IV semiconductor nanoparticles.

In some configurations, halogen-containing compounds may be directed into the processing chamber with hydrogen ($H_2$). The nanoparticles may be contacted with a halogen-containing compound for a time sufficient to remove oxygen from the nanoparticles. A fabrication (sintering) step may follow according to any of the configurations described in the context of FIGS. 6-8. As an example, following exposure of the nanoparticles to a halogen-containing compound at room temperature, the nanoparticles may be heated to the fabrication temperature, maintained at that temperature for a time sufficient to form the thin film, and cooled to room temperature.

In some cases, such as when the halogen-containing compound is $F_2$, oxide removal may be initiated with ultraviolet (UV) light incident on the nanoparticles. In some configurations, the halogen-containing compound (e.g., $F_2$) may be directed into the processing chamber with $H_2$. In an exemplary configuration, after $F_2$ and hydrogen are directed into the processing chamber, UV light is applied on the nanoparticles to induce removal of silicon oxide layers over the nanoparticles, and the flow of $F_2$ and hydrogen is terminated after a predetermined time period. In one configuration, following oxygen removal, the flow of the halogen-containing compound into the processing chamber is terminated but the flow of hydrogen into the processing chamber is maintained. With the application of plasma power to form hydrogen plasma, as per the illustrated configuration of FIGS. 8A-8B, this advantageously enables removal of any residual oxygen and other impurities during the fabrication of the thin film at elevated temperatures.

The substrate may be rapidly cooled following Group IV semiconductor thin film fabrication. Rapid cooling may advantageously provide improved material properties, such as improved robustness, porosity and density. Rapid cooling may also freeze hydrogen atoms at binding and anti-binding sites adjacent to Group IV semiconductor and impurity atoms, thereby increasing the effectiveness of the passivation of defects, which improves electrical performance. During cooling, migration of atoms and defects in the bulk of the semiconductor thin film is reduced. Rapidly cooling a thin film "freezes" the atoms of the thin film in the configuration produced using methods of various configurations. Thus, rapidly cooling a thin film formed at elevated temperatures, with the film having a low defect density and porosity, yields a thin film with improved material properties at low temperatures.

As an example, following the $t_3$-$t_4$ high temperature interval of FIG. 8A to form the Group IV semiconductor thin film 19, the thin film 19 may be rapidly cooled at a cooling rate of about 3500° C./minute to room temperature, or 25° C.

In FIGS. 6A, 7A and 8A, in some configurations, the substrate may be rapidly cooled at $t_3$. In FIGS. 6B, 7B and 8B, in other configurations, the substrate may be rapidly cooled at $t_3$, $t_5$, or $t_3$ and $t_5$. Rapid cooling may also be accompanied by exposure of the Group IV semiconductor thin film and/or substrate to hydrogen plasma. In FIG. 8A, in one configuration, the substrate may be rapidly cooled at $t_4$ while exposed to hydrogen plasma.

Generally, cooling rates may be selected to optimize Group IV semiconductor thin film properties. Substrates and/or Group IV semiconductor thin films may be cooled at a cooling rate preferably between about 10° C./minute and about 8000° C./minute, more preferably between about 1000° C./minute and about 5000° C./minute, and most preferably between about 2500° C./minute and about 4000° C./minute. In a configuration, the substrate and/or Group IV semiconductor thin film may be cooled at a cooling rate between about 3250° C./minute and 3750° C./minute. In some configurations, the substrate and/or Group IV semiconductor thin film may be cooled in multiple stages, such as a first stage and second stage. As an example, in FIG. 8B, the substrate and/or Group IV semiconductor thin film may be cooled in the $t_3$-$t_4$ interval (first stage) at a cooling rate of about 65° C./minute, and subsequently cooled at $t_5$ (second stage) at a cooling rate of about 55° C./minute. The substrate and/or Group IV semiconductor thin film may be cooled to about room temperature (25° C.).

In general, there are various methods for rapidly cooling the substrate and/or Group IV semiconductor thin film. For example, the substrate and/or Group IV semiconductor thin film may be cooled by exposing the substrate and/or Group IV semiconductor thin film to one or more gases, such as, e.g., noble gases (e.g., He, Ar), $O_2$, $N_2$, or air. In yet another configuration, the substrate may be cooled by bringing the substrate in contact with a metal block (e.g., stainless steel or copper block) maintained at a temperature substantially below the elevated temperatures used for thin film fabrication.

In one configuration, where, for example, the substrate is substantially thin, rapid cooling may be achieved by merely terminating substrate heating. The substrate thereafter undergoes conductive, convective, and/or radiative cooling. In another configuration, the sample may be moved from a heating area to a cooling area while exposed the hydrogen plasma. In other configurations, after the termination of substrate heating, any of the cooling methods discussed above may be employed.

In some configurations, substrates may be rapidly cooled while exposed to hydrogen ($H_2$) or hydrogen plasma. In the illustrated configuration of FIG. 8A, the substrate may be exposed to hydrogen plasma during cooling at $t_4$. In the illustrated configuration of FIG. 8B, the substrate may be exposed to hydrogen plasma during the $t_4$-$t_5$ cooling interval and during cooling at $t_6$. It will be appreciated that exposure to hydrogen plasma may be terminated at any point during rapid cooling by shutting off plasma generation.

EXAMPLE 1

An exemplary method for forming Group IV semiconductor thin films using hydrogen plasma, such as the methods discussed in the context of FIGS. 8A-B, will now be discussed.

Silicon nanoparticles prepared using methods previously described were deposited on a silicon wafer. The silicon wafer was subsequently transferred to a vacuum system having stainless steel vacuum fittings and a quartz chamber. The sample temperature was raised to about 800° C. in about 7 minutes. The chamber was then back filled with $H_2(g)$ and $Ar(g)$ at flow rates of about 60 sccm and 35 sccm, respectively. The chamber pressure was about $8.5 \times 10^{-1}$ torr. The sample was then exposed to the afterglow of hydrogen plasma (the hydrogen plasma was formed using a plasma power of 2.2 kW). The sample temperature was maintained at 800° C. for about 6 minutes, at which point heating was terminated and the sample was cooled to a temperature below 300° C. at a cooling rate of about 37° C./minute. Plasma generation was terminated when the sample temperature was about 300° C.

EXAMPLE 2

Silicon nanoparticles prepared using methods of configurations were deposited on a silicon wafer. The silicon wafer was subsequently transferred to an AK800 system, manufactured by Roth & Rau A G. The AK800 was continuously purged with $H_2(g)$ at a flow rate of about 100 sccm. The pressure of the AK800 chamber was maintained at about $5 \times 10^{-1}$ mbar (0.37 Torr). The sample temperature was ramped from about 26° C. to about 550° C. in about 5 minutes.

The sample was subsequently exposed to hydrogen plasma formed over the sample using a plasma generator, with a plasma power of about 1300 W and DC bias of about 150 V. A resistive heater was used to heat the sample. The sample was maintained at a temperature of about 550° C. for about 10 minutes, at which point heating was terminated and the sample was cooled to a temperature below 300° C. at a cooling rate of about 50° C./minute. Plasma generation was terminated when the sample temperature was about 300° C.

EXAMPLE 3

Silicon nanoparticles prepared using methods previously described were deposited on a silicon wafer. The silicon wafer was subsequently transferred to a vacuum system having stainless steel vacuum fittings and a quartz chamber. The sample temperature was raised to about 525° C. in about 7 minutes. The chamber was then back filled with $H_2(g)$ and $Ar(g)$ at flow rates of about 60 sccm and 35 sccm, respectively. The chamber pressure was about $8.5 \times 10^{-1}$ torr. The sample was then exposed to the afterglow of hydrogen plasma (the hydrogen plasma was formed using a plasma power of 2.2 kW). The sample temperature was maintained at 525° C. for about 10 minutes, at which point heating was terminated and the sample was cooled to a temperature below 300° C. at a cooling rate of about 37° C./minute. Plasma generation was terminated when the sample temperature was about 300° C.

EXAMPLE 4

Silicon nanoparticles prepared using methods of configurations were deposited on a silicon wafer. The silicon wafer was subsequently transferred to an AK800 system, manufactured by Roth & Rau A G. The AK800 was continuously purged with $H_2(g)$ at a flow rate of about 40 sccm. The pressure of the AK800 chamber was maintained at about $5 \times 10^{-1}$ mbar (0.37 Torr). The sample temperature was ramped from about 26° C. to about 650° C. in about 5 minutes.

The sample was subsequently exposed to $CF_4$:$H_2$ plasma formed over the sample using a plasma generator, with a plasma power of about 1300 W, DC bias of about 150 V, and a $CF_4(g)$ flow rate of about 100 sccm. A resistive heater was used to heat the sample. The sample was maintained at a temperature of about 650° C. for about 1 minute, at which point $CF_4$ flow was terminated. After an additional time of 7 minutes, heating was terminated and the sample was cooled to a temperature below 300° C. at a cooling rate of about 50° C./minute. Plasma generation was terminated when the sample temperature was about 300° C.

Having disclosed exemplary configurations and the best mode, it will be appreciated by those skilled in the art that various omissions, additions and modifications may be made to the disclosed configurations while remaining within the subject and spirit of the invention. All such modifications and changes are intended to fall within the scope of the invention, as defined by the appended claims.

What is claimed is:

1. A method for producing a Group IV semiconductor thin film in a chamber, the method comprising:
  positioning a substrate in the chamber, wherein the chamber has a chamber pressure;
  depositing a nanoparticle ink on the substrate to form a layer, the nanoparticle ink including a set of Group IV semiconductor nanoparticles and a solvent, wherein each nanoparticle of the set of Group IV semiconductor nanoparticles includes a nanoparticle surface and a set of oxygen atoms;
  striking a hydrogen plasma, wherein the set of Group IV semiconductor nanoparticles is substantially passivated;
  heating the layer to a fabrication temperature of between about 300° C. and about 1350° C., and between about 1 nanosecond and about 10 minutes;
  wherein the Group IV semiconductor thin film is formed.

2. The method of producing a Group IV semiconductor thin film in a chamber according to claim 1, further including the step of cooling the Group IV semiconductor thin film at a cooling rate, after the step of heating the layer to a fabrication temperature.

3. The method of producing a Group IV semiconductor thin film in a chamber according to claim 2, wherein the cooling rate is between about 10° C./minute and about 8000° C./minute.

4. The method of producing a Group IV semiconductor thin film in a chamber according to claim 2, wherein the cooling rate is between about 1000° C./minute and about 5000° C./minute.

5. The method of producing a Group IV semiconductor thin film in a chamber according to claim 2, wherein the cooling rate is between about 2500° C./minute and about 4000° C./minute.

6. The method of producing a Group IV semiconductor thin film in a chamber according to claim 1, wherein the chamber pressure is ambient pressure.

7. The method of producing a Group IV semiconductor thin film in a chamber according to claim 4, further including the step of reducing the chamber pressure to between about $1 \times 10^{-7}$ Torr and about $1 \times 10^{-4}$ Torr, before the step of striking a hydrogen plasma.

8. The method of producing a Group IV semiconductor thin film in a chamber according to claim 1, further including the step of removing at least some oxygen atoms of the set of oxygen atoms with an oxygen removal agent, before the step of striking a hydrogen plasma.

9. The method of producing a Group IV semiconductor thin film in a chamber according to claim 8, wherein the oxygen removal agent is a chemical etchant selected from the group consisting of $C_xH_yG_z$ (wherein 'x'>0, 'y'≧0 and 'z'>0 and 'G' includes one or more halogens), $CF_4$, $SF_6$, $SiF_6$, $NF_3$ and $XeF_3$.

10. The method of producing a Group IV semiconductor thin film in a chamber according to claim 9, wherein the oxygen removal agent is the hydrogen plasma.

11. The method of producing a Group IV semiconductor thin film in a chamber according to claim 9, wherein the oxygen removal agent a halogen-containing compound.

12. A method for producing a Group IV semiconductor thin film in a chamber, the method comprising:
   positioning a substrate in the chamber, wherein the chamber has a chamber pressure;
   depositing a nanoparticle ink on the substrate to form a layer, the nanoparticle ink including a set of Group IV semiconductor nanoparticles and a solvent, wherein each nanoparticle of the set of Group IV semiconductor nanoparticles includes a nanoparticle surface and a set of oxygen atoms;
   heating the layer to a fabrication temperature of between about 300° C. and about 1350° C., and between about 1 nanosecond and about 10 minutes;
   striking a hydrogen plasma, wherein the set of Group IV semiconductor nanoparticles is substantially passivated;
   wherein the Group IV semiconductor thin film is formed.

13. The method of producing a Group IV semiconductor thin film in a chamber according to claim 12, further including the step of cooling the Group IV semiconductor thin film at a cooling rate, after the step of heating the layer to a fabrication temperature.

14. The method of producing a Group IV semiconductor thin film in a chamber according to claim 13, wherein the cooling rate is between about 10° C./minute and about 8000° C./minute.

15. The method of producing a Group IV semiconductor thin film in a chamber according to claim 13, wherein the cooling rate is between about 1000° C./minute and about 5000° C./minute.

16. The method of producing a Group IV semiconductor thin film in a chamber according to claim 13, wherein the cooling rate is between about 2500° C./minute and about 4000° C./minute.

17. The method of producing a Group IV semiconductor thin film in a chamber according to claim 12, wherein the chamber pressure is ambient pressure.

18. The method of producing a Group IV semiconductor thin film in a chamber according to claim 17, further including the step of reducing the chamber pressure to between about $1\times10^{-7}$ Torr and about $1\times10^{-4}$ Torr, before the step of striking a hydrogen plasma.

19. The method of producing a Group IV semiconductor thin film in a chamber according to claim 12, further including the step of removing at least some oxygen atoms of the set of oxygen atoms with an oxygen removal agent, before the step of striking a hydrogen plasma.

20. The method of producing a Group IV semiconductor thin film in a chamber according to claim 19, wherein the oxygen removal agent is a chemical etchant selected from the group consisting of $C_xH_yG_z$ (wherein 'x'>0, 'y'≧0 and 'z'>0 and 'G' includes one or more halogens), $CF_4$, $SF_6$, $SiF_6$, $NF_3$ and $XeF_3$.

21. The method of producing a Group IV semiconductor thin film in a chamber according to claim 19, wherein the oxygen removal agent is the hydrogen plasma.

22. The method of producing a Group IV semiconductor thin film in a chamber according to claim 19, wherein the oxygen removal agent is a halogen-containing compound.

23. The method of producing a Group IV semiconductor thin film in a chamber according to claim 21 wherein hydrogen plasma includes a halogen-containing compound.

* * * * *